(12) United States Patent
Usami et al.

(10) Patent No.: US 7,482,263 B2
(45) Date of Patent: Jan. 27, 2009

(54) SEMICONDUCTOR DEVICE AND METHOD FOR MANUFACTURING THE SAME

(75) Inventors: Tatsuya Usami, Kanagawa (JP); Noboru Morita, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 304 days.

(21) Appl. No.: 11/386,234

(22) Filed: Mar. 22, 2006

(65) Prior Publication Data

US 2006/0166488 A1    Jul. 27, 2006

Related U.S. Application Data

(62) Division of application No. 10/763,847, filed on Jan. 23, 2004, now Pat. No. 7,045,895.

(30) Foreign Application Priority Data

Jan. 31, 2003   (JP) ............................... 2003-24350
Jun. 19, 2003   (JP) ............................... 2003-175627

(51) Int. Cl.
    *H01L 21/4763* (2006.01)
(52) U.S. Cl. ................. 438/627; 438/623; 438/637
(58) Field of Classification Search ................. 438/622, 438/623, 627, 637, 643, 653, 680, 687
    See application file for complete search history.

(56) References Cited

U.S. PATENT DOCUMENTS

| | | | | |
|---|---|---|---|---|
| 6,417,092 B1* | 7/2002 | Jain et al. | .................... | 438/624 |
| 6,436,824 B1* | 8/2002 | Chooi et al. | ................. | 438/687 |
| 6,764,952 B1* | 7/2004 | Yu et al. | .................... | 438/687 |
| 2004/0173908 A1* | 9/2004 | Barth et al. | ................. | 257/760 |

FOREIGN PATENT DOCUMENTS

| | | |
|---|---|---|
| CN | 1308375 | 8/2001 |
| WO | WO02/17374 A1 | 2/2002 |

* cited by examiner

*Primary Examiner*—Kevin M Picardat
(74) *Attorney, Agent, or Firm*—Muirhead and Saturnelli, LLC

(57) ABSTRACT

An object of the present invention is to improve the inter-layer adhesiveness of the diffusion barrier film while maintaining the lower dielectric constant of the diffusion barrier film. A diffusion barrier film for a copper interconnect comprises an insulating material containing silicon, carbon, hydrogen and nitrogen as constituent elements, and also containing Si—H bond, Si—C bond and methylene bond ($-CH_2-$). The insulating material involves $I_2/I_1$ of not lower than 0.067 and $I_3/I_1$ of not higher than 0.0067 appeared in an infrared absorption spectrum; where $I_1$ is defined as an absorption area of the infrared absorption band having a peak near 810 cm$^{-1}$, $I_2$ is defined as an absorption area of the infrared absorption band having a peak near 2,120 cm$^{-1}$ and $I_3$ is defined as an absorption area of the infrared absorption band having a peak near 1,250 cm$^{-1}$.

17 Claims, 25 Drawing Sheets

FIG. 8

| DIELECTRIC CONSTANT (at 1 MHz) | 2.9 |
|---|---|
| REFRACTIVE INDEX (at 633 nm) | 1.39 |
| STRESS (dyne/cm$^2$) | 7.00 X 10$^8$ |
| HARDNESS (GPa) | 0.9 |
| ELASTICITY (GPa) | 6 |
| THERMAL EXPANSION COEFFICIENT (ppm/deg-C) | 18 |
| GLASS TRANSITION TEMPERATURE (deg-C) | NA |
| THERMAL CONDUCTIVITY (W/mK, at 25 deg-C) | 0.31 |

FIG. 15

| PRESSURE (Torr) | 3.0 | 3.5 | 4.0 | 4.5 | 5.0 |
|---|---|---|---|---|---|
| $CH_3 : CH_2$ | < | < | < | > | > |
| Adhesion | ○ | ○ | ○ | × | × |

SEMICONDUCTOR DEVICE AND METHOD FOR MANUFACTURING THE SAME

CROSS REFERENCE TO RELATED APPLICATIONS

This application is a divisional of U.S Application Ser. No. 10/763,847 filed Jan. 23, 2004 now U.S. Pat. No. 7,045,895.

This application is based on Japanese patent application NO. 2003-024350 and Japanese patent application NO. 2003-175627, the content of which is incorporated hereinto by reference.

BACKGROUND OF THE INVENTION

1. Field of the Invention

The present invention relates to a technology for improving an adhesiveness of an interlayer insulating film employing an insulating material having a lower dielectric constant.

2. Description of the Related Art

In recent years, for the purpose of satisfying the increasing requirements for obtaining higher level of the integration of semiconductor devices, copper becomes to be widely employed for material of interconnects or plugs. Copper is a material, which is characterized in having lower resistance and better electromigration resistance than that of aluminum that has been conventionally employed.

Meanwhile, it is known that copper diffuses within an insulating film comprising a silicon compound or the like at a higher rate. Thus, when copper is employed for the interconnect material, it is common that the side surface and the lower surface of the copper interconnect are covered with a barrier metal and the upper surface thereof is covered with a diffusion barrier film. Conventionally, SiN and the like are widely used for the diffusion barrier film, and recently SiCN having lower dielectric constant becomes to be often employed in view of reducing the crosstalk between the interconnects (JP-A-2002-319,619, claim 5 and paragraph 0029).

However, when the diffusion barrier film is formed by using SiCN, the production yield of the vias is often reduced, or the adhesiveness between the diffusion barrier film and the underlying insulating film is often deteriorated. These features will be described below in reference to the annexed figures. FIGS. 1A to 1D show an example of a single damascene process utilizing SiCN for the diffusion barrier film.

First, a first insulating film 301 and $SiO_2$ film 302 are deposited in sequence on a silicon substrate that includes devices such as transistors formed thereon. These deposited films are partially etched to form an interconnect trench, and thereafter a barrier metal 303 and a copper film are deposited. Subsequently, chemical mechanical polishing (CMP) processing is carried out to form a copper interconnect 304, side surface and bottom surface of which are coated with the barrier metal 303. Thereafter, a SiCN film 306, which functions as a diffusion barrier film for copper, is formed on the entire surface of the substrate, and then a second insulating film 308 is deposited thereon. Further, a resist 310 having a predetermined aperture is formed thereon (FIG. 1A).

Subsequently, the second insulating film 308 is partially etched via the mask of the resist 310 to form a via hole 312, which extends to the surface of the SiCN film 306 (FIG. 1B).

Next, the resist 310 is stripped by an oxygen plasma ashing process, and then etch back processing is conducted to remove the SiCN film 306 disposed on the copper interconnect 304 (FIG. 1C).

Thereafter, a barrier metal and a copper film are formed on the entire surface thereof, and then the portions of the copper film and the barrier metal outside of the via hole are removed by the CMP processing to form a via plug 320 that is coupled to the copper interconnect 304 (FIG. 1D).

However, it is difficult to sufficiently improve the production yield when such process is employed. More specifically, when the resist 310 is stripped off from the multi-layer structure shown in FIG. 1B via the ashing process, carbon contained in the SiCN film 306 may react with oxygen contained in the plasma, thereby damaging the SiCN film 306. Although one via hole is shown in FIGS. 1B and 1C, a plurality of via holes are simultaneously formed on the entire surface of the wafer in the practical process. Thus, at the stage after the ashing process, the thickness and the condition of the SiCN films 306 disposed on the bottom of the via holes may be different by each of the plurality of the via holes, resulting in causing over-etching in some of the via holes when the SiCN films 306 of the bottom of the via holes are etched off in the process shown in FIG. 1C. In the over-etched vias, the surface of the copper interconnect 304 is exposed to the plasma, and thus the quality of the copper film may be deteriorated such that the contact resistance with the via plug 320 is increased.

Also, sufficient adhesiveness between the SiCN film 306 and the $SiO_2$ film 302 overlying thereof may not be obtained, and thus peeling off may be caused between these layers in the extreme case.

These defects in the contacting nature and the adhesiveness may lead to the decrease of the production yield and the deterioration of the reliability of the devices.

Meanwhile, an example of evaluating the technology of controlling the quality of the SiCN film is disclosed in the related art. In claim 1, paragraphs 0011, 0012 and 0026 and FIG. 1 of JP-A-2002-83,870, it is disclosed that, concerning SiCN employed for the etch stop, SiCN etch stop film having better etching selectivity to the underlying film and having lower dielectric constant can be obtained by controlling the number of functional groups having carbon-hydrogen bond contained in the SiCN film. That is, JP-A-2002-83,870 is directed to solve the technical problem occurred in the case where a film corresponding to the $SiO_2$ film 302 of FIGS. 1A to 1D is replaced with a SiCN film (claim 1, paragraphs 0011, 0012 and 0026, FIG. 1, or the like of JP-A-2002-83,870). Thus, the disclosure of JP-A-2002-83,870 provides a guidance for designing the SiCN as the etch stop film, and does not provide an useful information for designing the vias or interconnect structures in the case where SiCN is employed for the diffusion barrier film. The diffusion barrier film that covers the upper surface of the metal film functions as preventing the diffusion of metals and further functions as protecting the copper surface during etching the via holes. Thus, the other view point than that of JP-A-2002-83,870 which is related to the etch stop film is necessary for designing the SiCN film utilizing as the diffusion barrier film.

SUMMARY OF THE INVENTION

In view of the above situation, the present invention provides a solution to the above-mentioned problems, and it is an object of the present invention to improve the reliability of the device as well as improving the production yield in the case of employing the interconnect structure comprising a film containing silicon, carbon, hydrogen and nitrogen for a diffusion barrier film disposed on a metal film of an interconnect or plug. More specifically, it is an object of the present invention to improve the inter-layer adhesiveness of the diffusion barrier film while maintaining the lower dielectric constant of the diffusion barrier film.

According to the present invention, there is provided a semiconductor device comprising: a semiconductor substrate; a metal film formed on the semiconductor substrate; and a diffusion barrier film covering an upper surface of the metal film, wherein the diffusion barrier film comprises an insulating material containing silicon, carbon, hydrogen and nitrogen as constituent elements, and wherein the insulating material contains Si—H bond, Si—C bond and methylene bond (—$CH_2$—).

The insulating material included in the diffusion barrier film of the present invention has a molecular structure having respective chemical bonds listed above. Since a diffusion barrier film according to the present invention contains methylene bond (—$CH_2$—), improved resistance to the ashing processing that is conducted in the resist stripping process can be provided thereto, thereby effectively inhibiting the problem of damaging the metal film, which has been described in the description of the related art. Since a diffusion barrier film according to the present invention contains both methylene bond (—$CH_2$—) and Si—H bond, improved adhesiveness thereof with a film disposed thereunder or with a film disposed thereon can be provided. Since a diffusion barrier film according to the present invention contains Si—C bond, the dielectric constant thereof can be effectively reduced.

Here, when the insulating film designed to present an infrared absorption spectrum thereof, which includes:

$I_2/I_1$ of not lower than 0.067;

where $I_1$ is defined as an absorption area of an infrared absorption band having a peak near 810 $cm^{-1}$; and $I_2$ is defined as an absorption area of an infrared absorption band having a peak near 2,120 $cm^{-1}$, the dielectric constant of the diffusion barrier film can further surely be reduced.

Also, when the insulating film designed to present an infrared absorption spectrum thereof, which includes:

$I_3/I_1$ of not higher than 0.0067;

where $I_1$ is defined as an absorption area of an infrared absorption band having a peak near 810 $cm^{-1}$, and $I_3$ is defined as an absorption area of an infrared absorption band having a peak near 1,250 $cm^{-1}$, the adhesiveness of the diffusion barrier film with a film disposed thereunder or with a film disposed thereon can be further improved, and the ability of preventing the diffusion of the metal from the metal film to the interlayer insulating film is considerably improved.

The relationship of the above-mentioned $I_1$, $I_2$ and $I_3$ with the properties of the diffusion barrier film will be fully described later in the examples. Here, the term "absorption area" appeared in the above description means an area circumscribed with an absorption curve and the base line in the infrared absorption spectrum. In general, the base lines for the respective infrared absorption bands may be drawn within the following range.

$I_1$: 600-1,220 $cm^{-1}$;
$I_2$: 1,900-2,500 $cm^{-1}$; and
$I_3$: 1,220-1,300 $cm^{-1}$.

According to the present invention, there is provided a method for manufacturing a semiconductor device, comprising: forming a first insulating film on a semiconductor substrate; selectively removing the first insulating film to form an interconnect trench; filling the interconnect trench with a metal to form a metal film; and depositing a diffusion barrier film including an insulating material containing silicon, carbon, hydrogen and nitrogen as constituent elements to cover the upper surface of the metal film, wherein the depositing the diffusion barrier film is conducted by a plasma CVD utilizing a source gas containing: (a) trimethylsilane or tetramethylsilane; and (b) a nitrogen-containing compound, and wherein a pressure during the depositing the diffusion barrier film is not higher than 4 Torr.

The manufacturing method having this configuration can provide a stable formation of the diffusion barrier film having lower dielectric constant and improved inter-layer adhesiveness, thereby providing an improvement in the reliability of the devices as well as providing an improvement in the production yield thereof.

According to the present invention, there is also provided a method for manufacturing a semiconductor device, comprising: forming a first insulating film on a semiconductor substrate; selectively removing the first insulating film to form an interconnect trench; filling the interconnect trench with a metal to form a metal film; and depositing a diffusion barrier film including an insulating material containing silicon, carbon, hydrogen and nitrogen as constituent elements to cover the upper surface of the metal film, wherein the depositing the diffusion barrier film is conducted by a plasma CVD utilizing a source gas containing: (a) vinyl group-containing silane; and (b) a nitrogen-containing compound.

The vinyl group-containing silane may contain any one of trimethylvinylsilane, dimethyldivinylsilane, monomethyltrivinylsilane, or tetravinylsilane.

The manufacturing method having this configuration can provide a further stable formation of the diffusion barrier film having lower dielectric constant and improved inter-layer adhesiveness.

As described above, the present invention has the configuration having the SiCN film as the diffusion barrier film disposed on the metal film having a specified structure, and thus semiconductor devices capable of manufacturing with improved production yield and having higher reliability are provided.

This summary of the invention does not necessarily describe all necessary features so that the invention may also be a sub-combination of these described features.

BRIEF DESCRIPTION OF THE DRAWINGS

FIG. 8 is a table showing the physical properties of the L-Ox™.

FIG. 15 is a graph showing the dependency of the deposition pressure on the inter-layer adhesiveness of the SiCN film.

DETAILED DESCRIPTION OF THE INVENTION

The invention will now be described based on the preferred embodiments. This does not intend to limit the scope of the present invention, but exemplify the invention.

The present invention is more effective when the metal film contains copper as its main constituent. For example, a copper interconnect containing an impurity of other element than copper or an interconnect of an alloy of copper and silver may be employed. The metal film of the present invention may be obtained by forming a film of metal via plating, CVD, sputtering or the like, and thereafter processing the formed film of metal as necessary. For example, a metal film, which is provided as a form of a film embedded in the insulating film may be formed by a damascene processing. The diffusion barrier film according to the present invention exhibits a considerable ability of preventing the diffusion of the metal from the metal film that contains copper as the main constituent as described above. The metal film constitutes a metal interconnect, an interlayer coupling plug, a pad or the like.

The present invention may include forming an insulating film containing ladder-shaped siloxane hydride, being disposed adjacent to the upper surface of the diffusion barrier film. Ladder-shaped siloxane hydride has lower dielectric constant and better mechanical stability and chemical stability. Since the present invention employs the diffusion barrier film having considerably improved adhesiveness with ladder-shaped siloxane hydride, better performances of ladder-shaped siloxane hydride can be fully utilized and the stable layer structure can be achieved.

Ladder-shaped siloxane hydride is a polymer having a ladder-shaped molecular structure, and preferably has a dielectric constant of not higher than 2.9 in view of preventing the interconnect delay, and preferably has lower film density. For example, the polymer preferably has a film density within a range of from 1.50 g/cm$^3$ to 1.58 g/cm$^3$, and has a refractive index at a wavelength of 633 nm within a range of from 1.38 to 1.40. L-Ox™ or the like may be illustrated as a typical film material.

Figure 7:
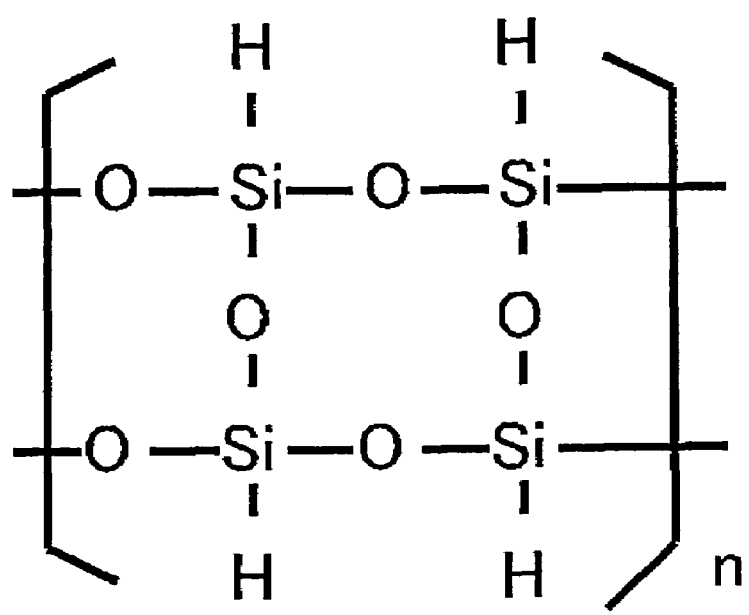
FIG. 7 is a chemical structure of L-Ox™ having ladder-shaped siloxane hydride structure.

FIG. 7 shows a chemical structure of the L-Ox™, which has ladder-shaped siloxane hydride structure. The sign "n" appeared in the structure indicates a positive number of equal to or greater than 1. FIG. 8 shows physical properties of the L-Ox™ having such chemical structure.

Figure 9:
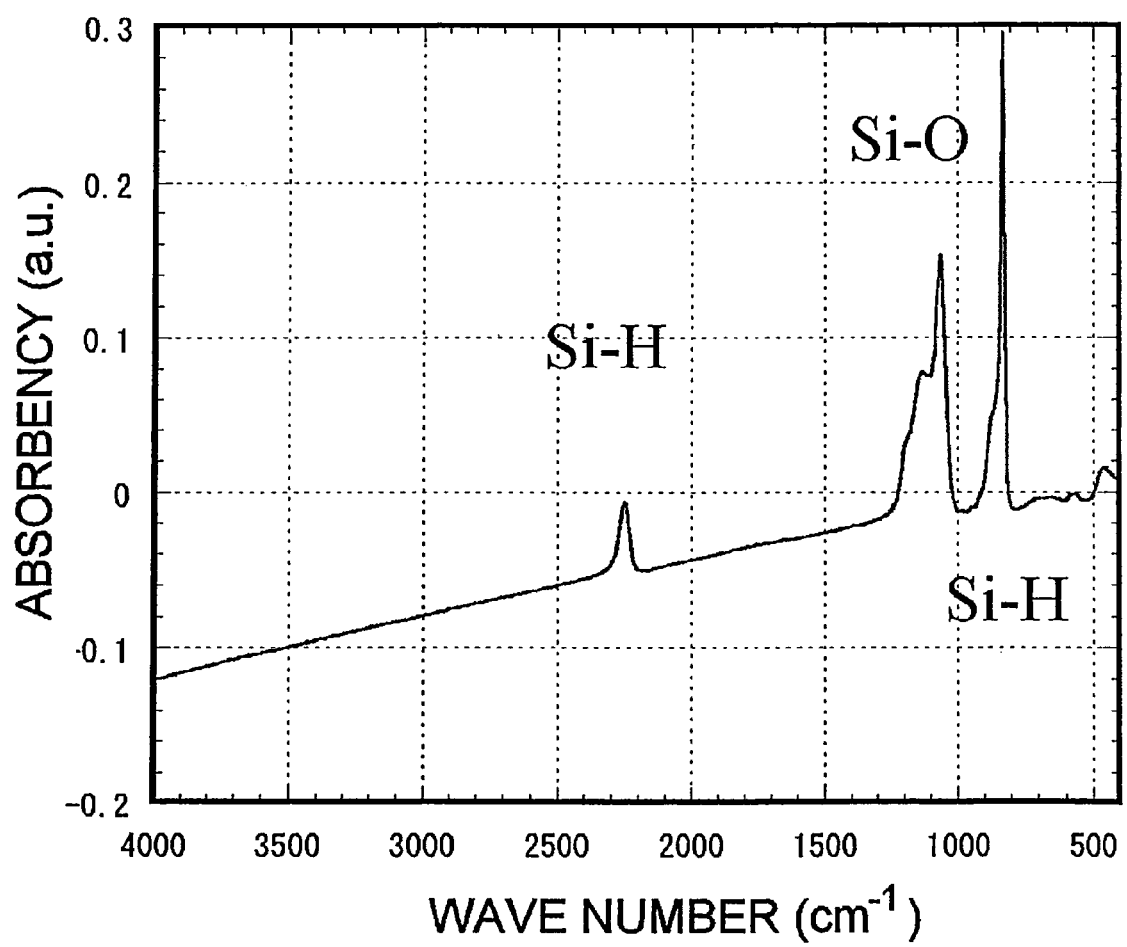
FIG. 9 is a chart of a FT-IR spectrum of the L-Ox™.

It was confirmed by the results of the FT-IR measurement shown in FIG. 9 that the L-Ox™ has the chemical structure shown in FIG. 7. The characteristic feature found in the chart of FIG. 9 is a sharp peak appeared at about 830 cm$^{-1}$ indicating the presence of Si—H bond, and the rapid ascent of the peak suggests that the L-Ox™ has a two-dimensional chemical structure. Also, an expected another peak indicating the presence of Si—H bond, which is expected to appear at a higher wave number side around approximately 870 cm$^{-1}$, is extremely small, and thus this also indicates that the material to be measured has the two-dimensional chemical structure.

The physical properties of the L-Ox™ are also variable depending on the baking temperature. This will be described on the basis of the disclosure of FIG. 10.

Figure 10:
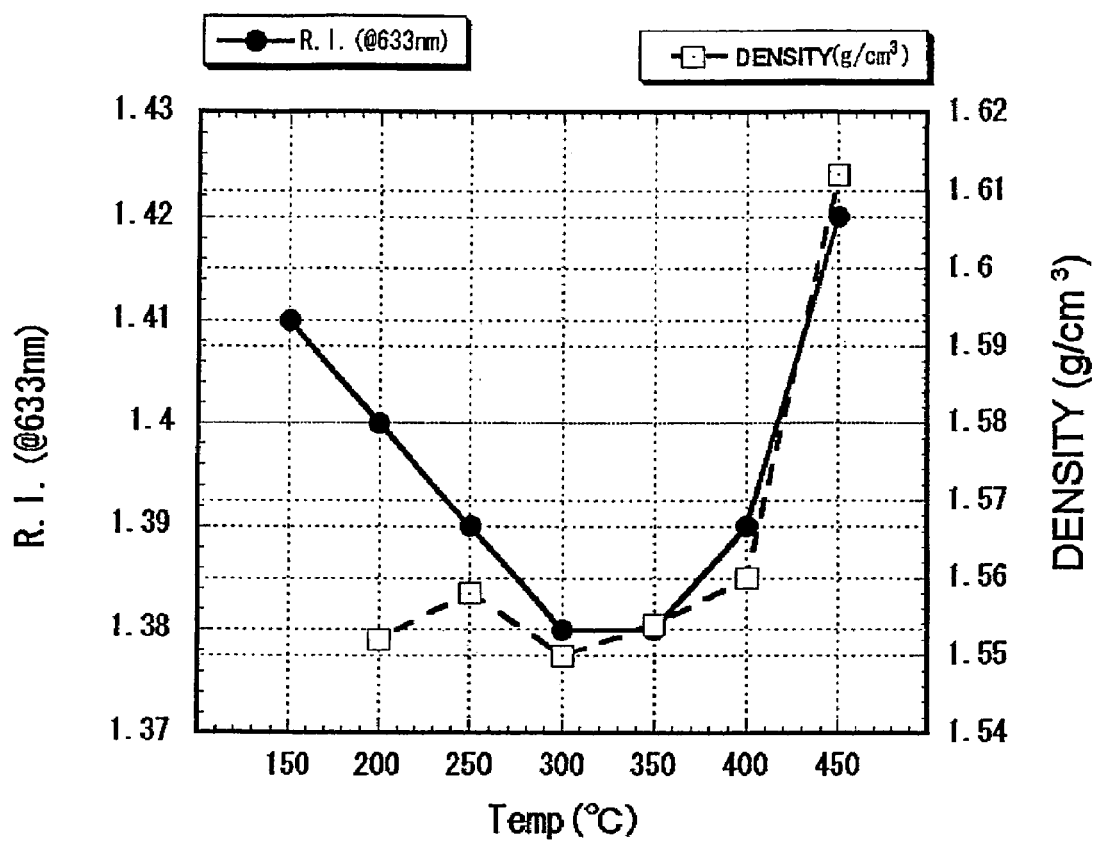
FIG. 10 is a graph showing the dependency of the baking condition on the film properties of the L-Ox™ film.

The L-Ox™ formed by baking within the inert gas atmosphere such as nitrogen or the like at a temperature within a range of from 200 degree C. to 400 degree C. has the following properties. In FIG. 10, "R.I." indicates the refractive index at a wavelength of 633 nm. The refractive index is a parameter that has an influence directly on the dielectric constant, and the value thereof varies within a range of from 1.38 to 1.40. The values of the refractive indexes thereof at a temperature lower than 200 degree C. or at a temperature higher than 400 degree C. were higher than 1.40.

The densities of the L-Ox™ formed by baking at a temperature from 200 degree C. to 400 degree C. were 1.50 g/cm$^3$ to 1.58 g/cm$^3$. The density of the film baked at a temperature higher than 400 degree C. was higher than 1.60 g/cm$^3$. The density of the film baked at a temperature lower than 200 degree C. was not measurable.

When the film was formed by baking at a temperature lower than 200 degree C., a peak appeared at about 3,650 cm$^{-1}$, which is thought to indicate the presence of Si—OH (silanol) bonding, was observed in the FT-IR spectrum. The film baked at a temperature of higher than 400 degree C. exhibited a noticeable increase of the density.

The above results indicate that the L-Ox™ having better properties as well as having lower dielectric constant can be stably obtained by baking at an atmosphere temperature from 200 degree C. to 400 degree C. when the insulating film including the L-Ox™ is deposited.

Figure 11:
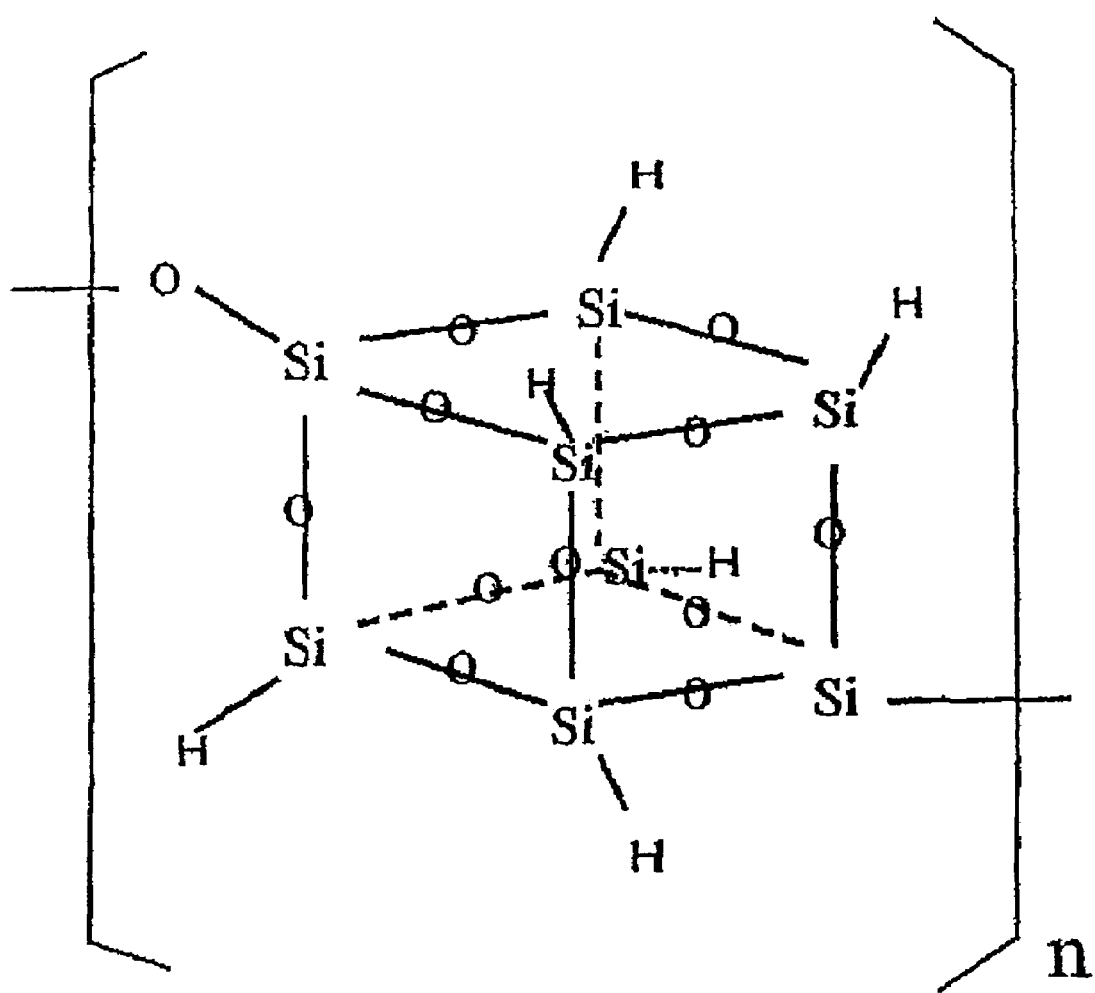
FIG. 11 is a molecular skeleton of HSQ.

FIG. 11 shows a molecular skeleton of conventionally known hydrogen silsesquioxane (HSQ) having siloxane hydride structure that is a three-dimensional chemical structure. (This is cited from "Semiconductor Technology Outlook", 1998, pp. 431-435.) The sign "n" is a positive number equal to or higher than 1.

The two materials having the above described structures have considerably different film stabilities during the manufacturing processes, and the L-Ox™ exhibits markedly superior film stability to HSQ. It is considered that this is because the decrease of Si—H content in L-Ox™ during the manufacturing process is lower than that in HSQ. It is also considered that the difference in the manner of forming bonds with hydrogen atoms is also a reason thereof. More specifically, in HSQ, hydrogen atom is bonded thereto at a corner of the cubic structure, and meanwhile in L-Ox™, hydrogen atom is bonded thereto at a portion of the side of the ladder structure. Therefore, the density around hydrogen atoms of HSQ is lower than that of L-Ox™, and thus it is considered that hydrogen bond included in HSQ is more reactive than hydrogen bond included in L-Ox™ for the structural reason.

Although the present invention has been described by way of exemplary embodiments, it should be understood that many changes and substitutions may be made by those skilled in the art without departing from the spirit and the scope of the present invention which is defined only by the appended claims.

EXAMPLES

The preferable embodiments according to the present invention will be described with reference to Examples.

(Infrared Absorption Spectrum for SiCN Film)

Before describing the Examples, the infrared absorption spectrum for SiCN film will be described on the basis of the data.

Figure 12:
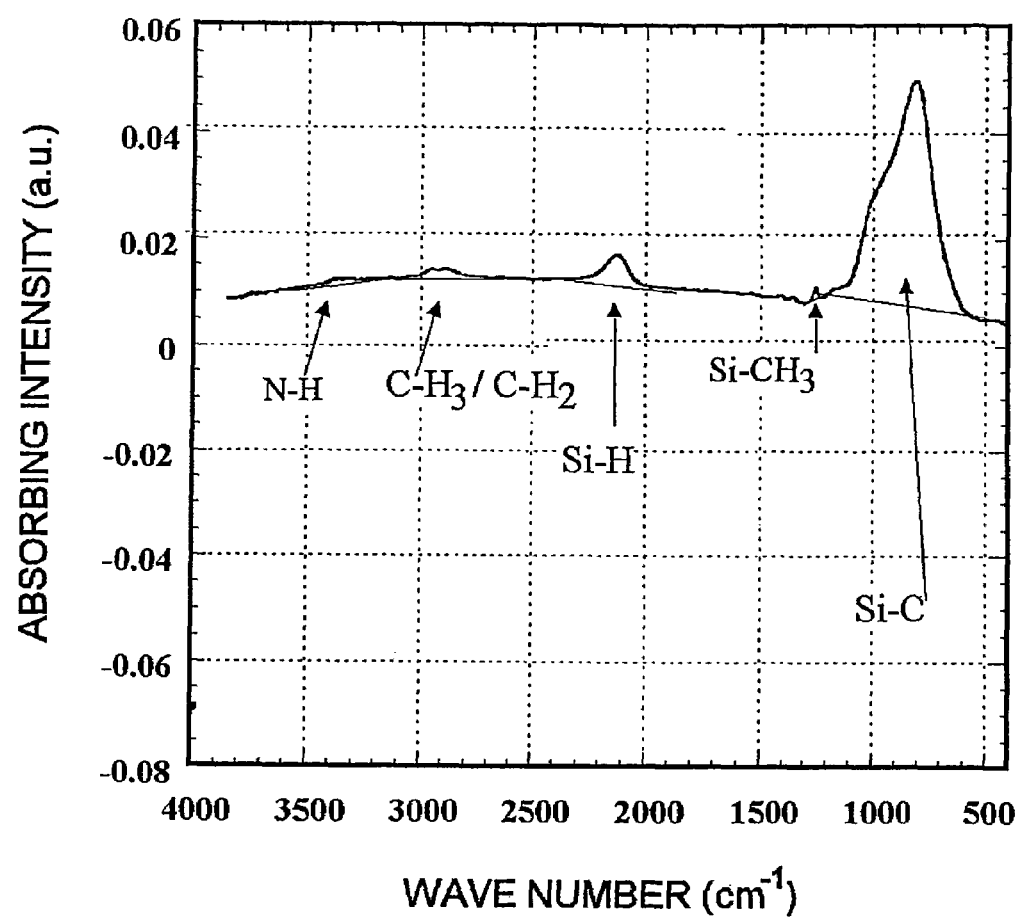
FIG. 12 is a chart of a FT-IR spectrum of the SiCN film.

FIG. 12 is a chart of FT-IR spectrum of SiCN film. Attributions of respective absorption bands are shown in the chart. In the Examples described later, an absorption area of an absorption band was obtained by drawing a base line shown in the cart, and calculating an area circumscribed with an absorption curve and the base line to provide the absorption area. Here, the term "absorption area" means an area circumscribed with the absorption curve and the base line in the infrared absorption spectrum.

(i) Infrared absorption band having a peak near wave number of 810 cm$^{-1}$;
Si—C bond;

The absorption area of this absorption band is designated as $I_1$.

(ii) Infrared absorption band having a peak near wave number of 2,120 cm$^{-1}$;
Si—H bond;

The absorption area of this absorption band is designated as $I_2$.

(iii) Infrared absorption band having a peak near wave number of 1,250 cm$^{-1}$;
Si—CH$_3$. bond;

The absorption area of this absorption band is designated as $I_3$.

The base lines for the respective infrared absorption bands may be generally drawn within the following range.

$I_1$: 600-1,220 cm$^{-1}$;
$I_2$: 1,900-2,500 cm$^{-1}$; and
$I_3$: 1,220-1,300 cm$^{-1}$.

Figure 13:
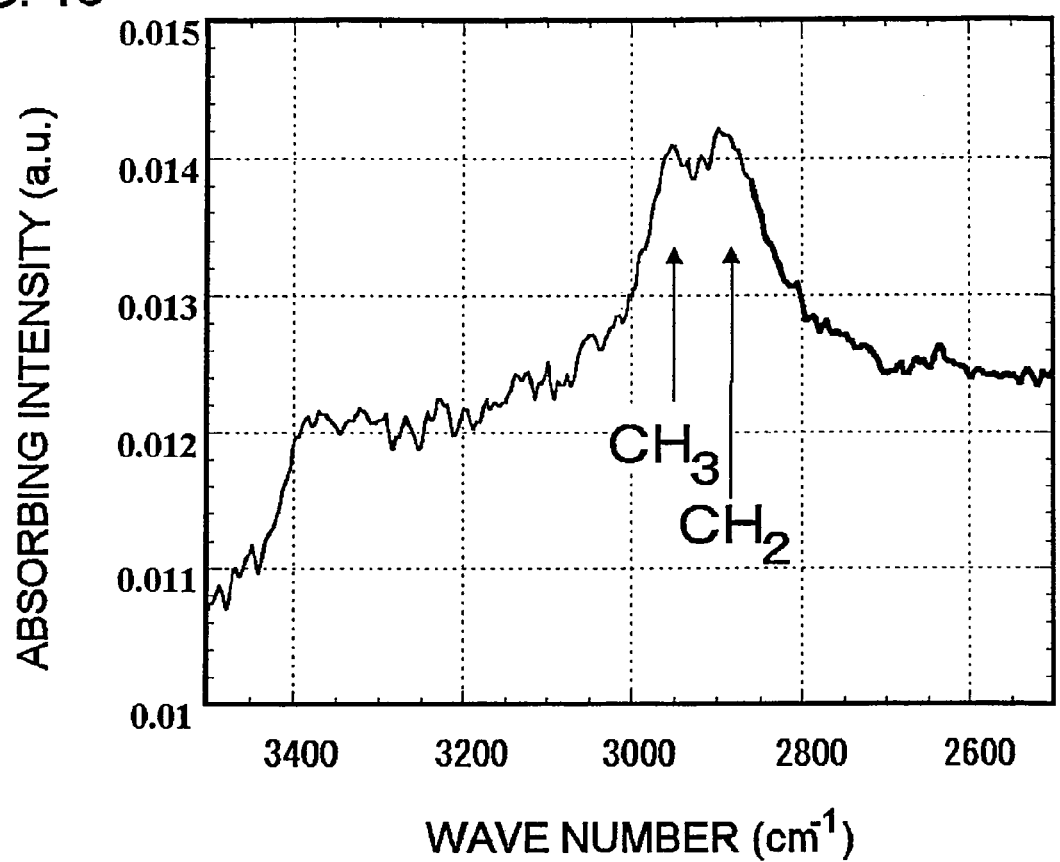
FIG. 13 is a chart of a FT-IR spectrum of the SiCN film.

FIG. 13 is an enlarged view of the absorption spectrum from the wave number of 3,500 cm$^{-1}$ to 2,500 cm$^{-1}$. It is seen that an absorbing band indicating the presence of methyl bond (—CH$_3$) appears in a higher-wave number side and an absorbing band indicating the presence of methylene bond (—CH$_2$—) appears in a lower-wave number side.

Example 1

In the present example, the influence of the pressure for depositing SiCN film on the infrared absorption profile of deposited films was evaluated by depositing SiCN films at different deposition pressures. In the present example, a silicon oxide film was deposited on a silicon substrate, and thereafter SiCN was deposited thereon via a plasma CVD. A parallel plate plasma CVD apparatus was employed for the deposition apparatus. The conditions for the deposition process were as follows.

(a) Volumetric flow rate of source gas:
trimethylsilane (3 MS) 150 sccm;
ammonia 300 sccm; and
helium 300 sccm;
(b) plasma power: 300 W; and
(c) deposition chamber pressure: 3 to 5 Torr.

Absorption areas for Si—C bond, Si—H bond and Si—CH$_3$ bond were measured for the respective deposited films. The measured absorption areas for Si—C bond, Si—H bond and Si—CH$_3$ bond were designated as $I_1$, $I_2$ and $I_3$, respectively, and the values of $I_2/I_1$ (Si—H bond/Si—C bond) and $I_3/I_1$ (Si—CH$_3$ bond/Si—C bond) were evaluated on the basis of the measured areas.

Further, the adhesiveness between the SiCN film and a silicon oxide film deposited on the SiCN film was evaluated by conducting a tape peeling test. More specifically, grooves having a lattice pattern were created on the SiCN film and the silicon oxide film was divided by using a cutter blade to separate them into a plurality of rectangular regions. Then, adhesive tape was posted on the surface of the SiCN film. The tape was pulled toward a predetermined direction, and the number of the rectangular regions, in which the peeling off was occurred on the SiCN, was counted. Determinations for the results of the evaluation were made: the sign "X" was presented if any peeling off was occurred, and the sign "O" was presented where no peeling of was occurred.

Figure 14:
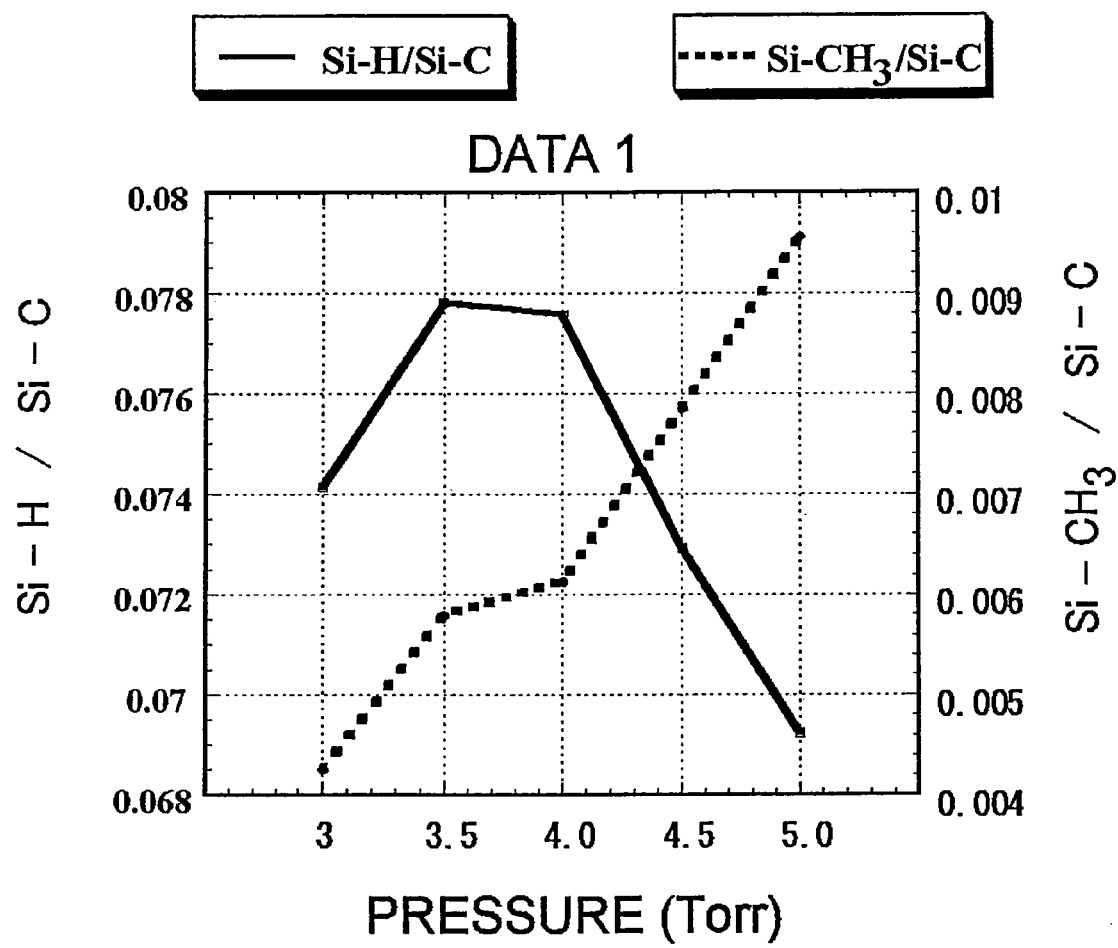
FIG. 14 is a graph showing the dependency of the deposition pressure on the infrared absorption properties of the SiCN film.

The test results are shown in FIGS. 14 and 15. In the table of FIG. 15, "Adhesion" indicates the results of the evaluation. Also, the sign "<" appeared in the column of "CH$_3$:CH$_2$" indicates that the absorption area for CH$_2$ (methylene bond) is larger than the absorption are for CH$_3$ (methyl bond) in the chart of FIG. 13, and the sign ">" indicates vice versa.

As seen in FIG. 14, it is found that the absorption area ratios of the above-mentioned absorption bands significantly depend on the deposition pressure. As seen in FIG. 15, it is also found that better adhesiveness is obtainable by having a pressure within a range of from 3 to 4 Torr.

Figure 16:
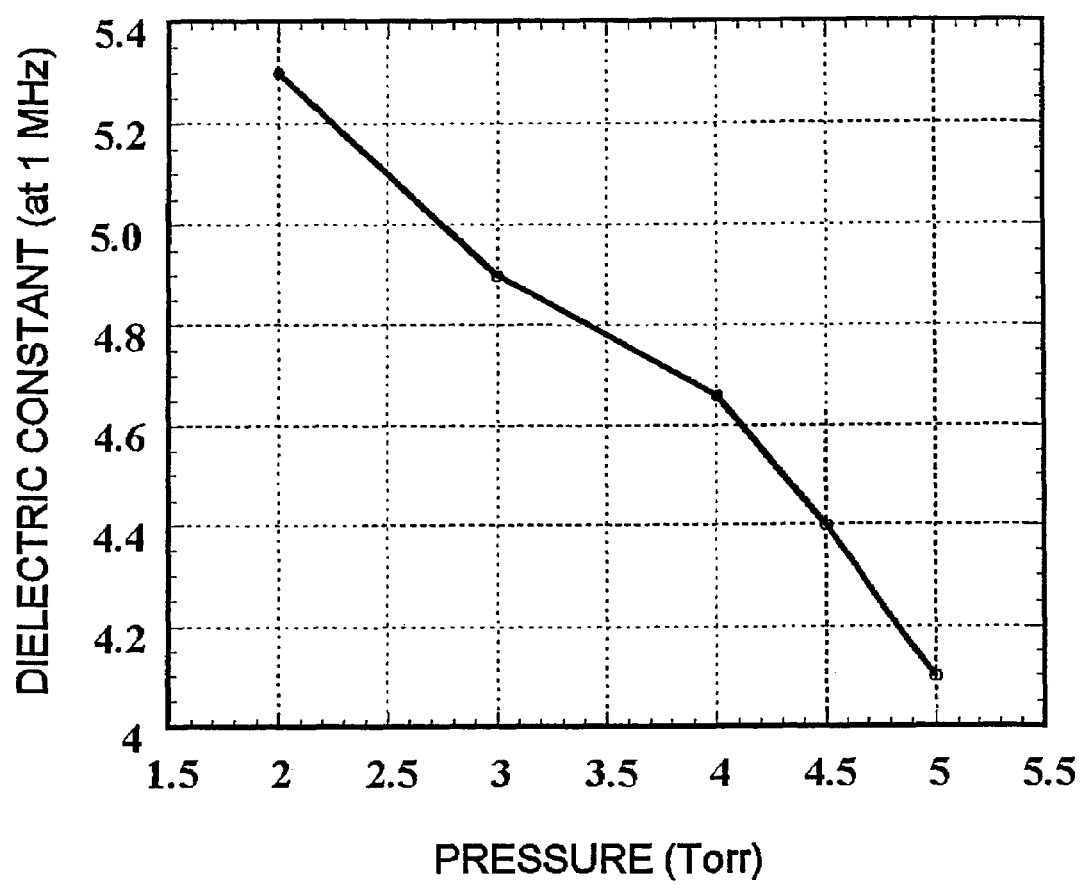
FIG. 16 is a graph showing the dependency of the deposition pressure on the dielectric constant of the SiCN film.

Next, films were deposited under the deposition conditions similar to the above-mentioned conditions except that the different deposition pressure was selected for the respective films from a range of from 2 to 5 Torr, and the dielectric constants (at 1 MHz) of the deposited films were measured. The results are shown in FIG. 16. It is found that the dielectric constant strongly depends on the pressure, and that higher pressure provides lower dielectric constant as long as the deposition pressure range of the present example is concerned.

Figure 17:
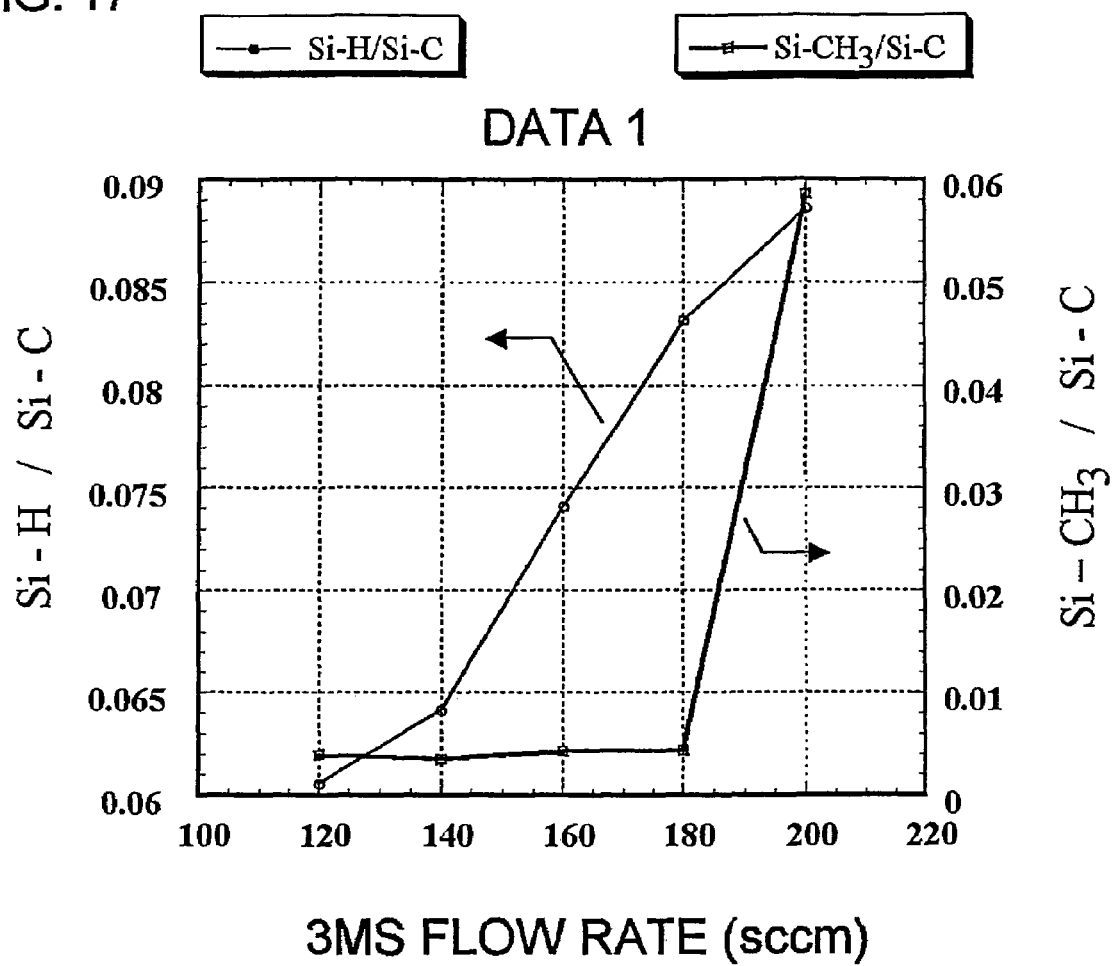
FIG. 17 is a graph showing the dependency of the flow rate of 3 MS on the infrared absorption properties of the SiCN film.

Here, the ratios of the absorption areas of the above-mentioned absorption bands also strongly depend on other deposition conditions in addition to the deposition pressure. FIG. 17 is a graph showing the results of measured values of $I_2/I_1$ (Si—H bond/Si—C bond) and $I_3/I_1$ (Si—CH$_3$ bond/Si—C bond) of the obtained films that were deposited by changing the flow rate of the trimethylsilane contained in the source gas.

As seen in the results shown in FIG. 17, it is found that, concerning the flow rate of the trimethylsilane contained in the source gas, the quantity of Si—CH$_3$ bond drastically increases when the selected flow rate thereof exceeds a certain value. When the volumetric flow rate of trimethylsilane was selected to 120 sccm, both of the quantities of Si—H and CH$_3$ decreased and dielectric constant of not lower than 5.0 was exhibited.

Example 2

In this example, various samples comprising SiCN films having various infrared absorption profiles were prepared by variously selecting the above-mentioned deposition conditions (a) to (c). Similarly as in the Example 1, SiCN film was deposited on the silicon oxide film formed on the silicon substrate.

Figure 18:
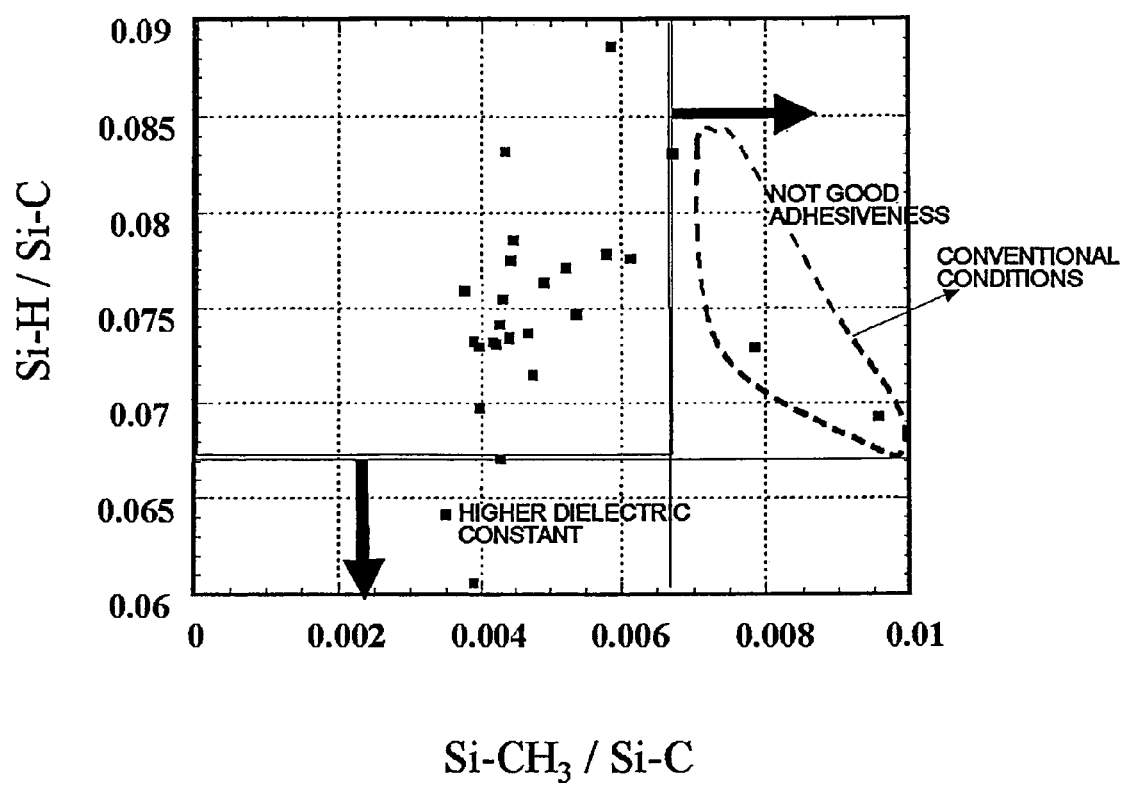
FIG. 18 is a graph showing the relationship of the infrared absorption properties of the SiCN film with the film properties thereof.

The dielectric constant and the adhesiveness with the silicon oxide film were evaluated for the obtained samples. The results are shown in FIG. 18. When a larger quantity of Si—CH$_3$ bond was contained and I$_3$/I$_1$ (Si—CH$_3$ bond/Si—C bond) was higher than 0.0067, a defect in the adhesiveness was occurred. When smaller quantity of Si—H bond was contained and I$_2$/I$_1$ (Si—H bond/Si—C bond) was not greater than 0.067, the relative dielectric constant thereof was not smaller than 5.0. Thus, it is found from the above evaluations that both the adhesiveness and the dielectric constant can be better if:

I$_3$/I$_1$ (Si—CH$_3$ bond/Si—C bond) is not greater than 0.0067; and

I$_2$/I$_1$ (Si—H bond/Si—C bond) is not smaller than 0.067.

It is also found from the figure that the region indicating that the contents of CH$_2$ bond is larger than the contents of CH$_3$ bond overlaps the region in which I$_3$/I$_1$ (Si—CH$_3$ bond/Si—C bond) is not greater than 0.007.

Example 3

Figure 19:
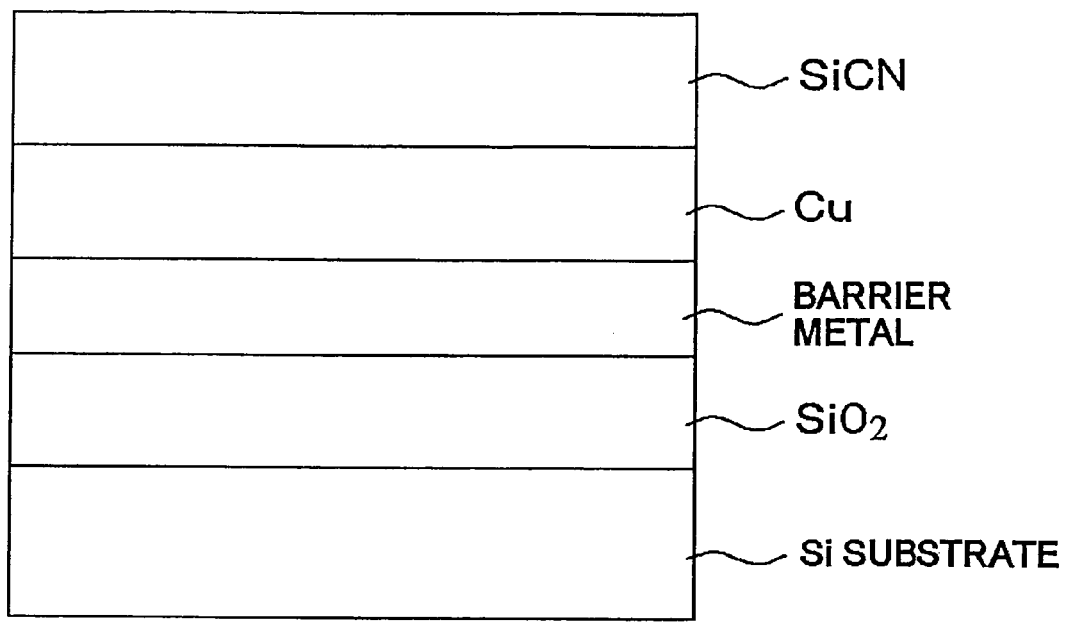
FIG. 19 is a cross sectional view of a multi-layer structure for evaluating the barrier properties of the SiCN film.

Two samples having a structure shown in FIG. 19 were prepared in different conditions for depositing the SiCN film, and the difference therebetween in the barrier performances to the thermal diffusion of copper were evaluated.

The deposition conditions for preparing the sample 1 were as follows.

(a) Volumetric flow rate of source gas:
trimethylsilane (3 MS) 150 sccm; ammonia 300 sccm; and helium 300 sccm;

(b) plasma power: 300 W; and (c) deposition chamber pressure: 3 Torr.

The deposition conditions for preparing the sample 2 were as follows.

(a) Volumetric flow rate of source gas:
trimethylsilane (3 MS) 150 sccm;
ammonia 300 sccm; and
helium 300 sccm;

(b) plasma power: 300 W; and (c) deposition chamber pressure: 5 Torr.

The infrared absorption spectrums of the obtained films were measured, and the results were as follows.

Sample 1:
I$_2$/I$_1$ (Si—H bond/Si—C bond)=0.074; and
I$_3$/I$_1$ (Si—CH$_3$ bond/Si—C bond)=0.004.

Sample 2:
I$_2$/I$_1$ (Si—H bond/Si—C bond)=0.070; and
I$_3$/I$_1$ (Si—CH$_3$ bond/Si—C bond)=0.0095.

Figure 20A:
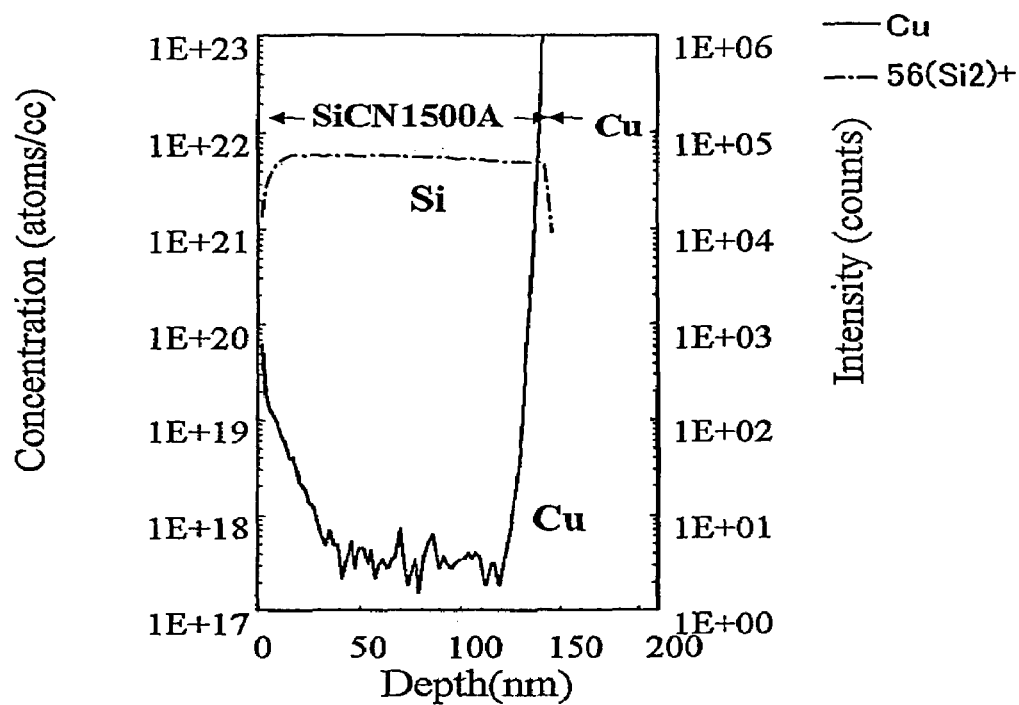
FIGS. 20A and 20B are graph showing the results of the evaluation of the barrier properties of the SiCN film.
Figure 20B:
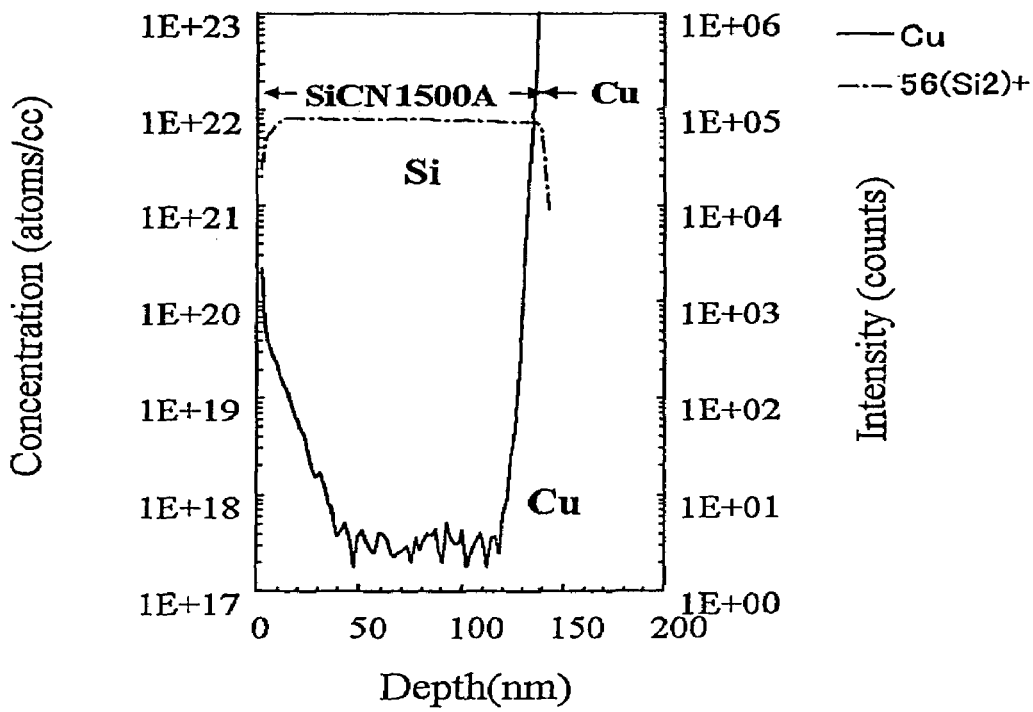
Figure 21A:
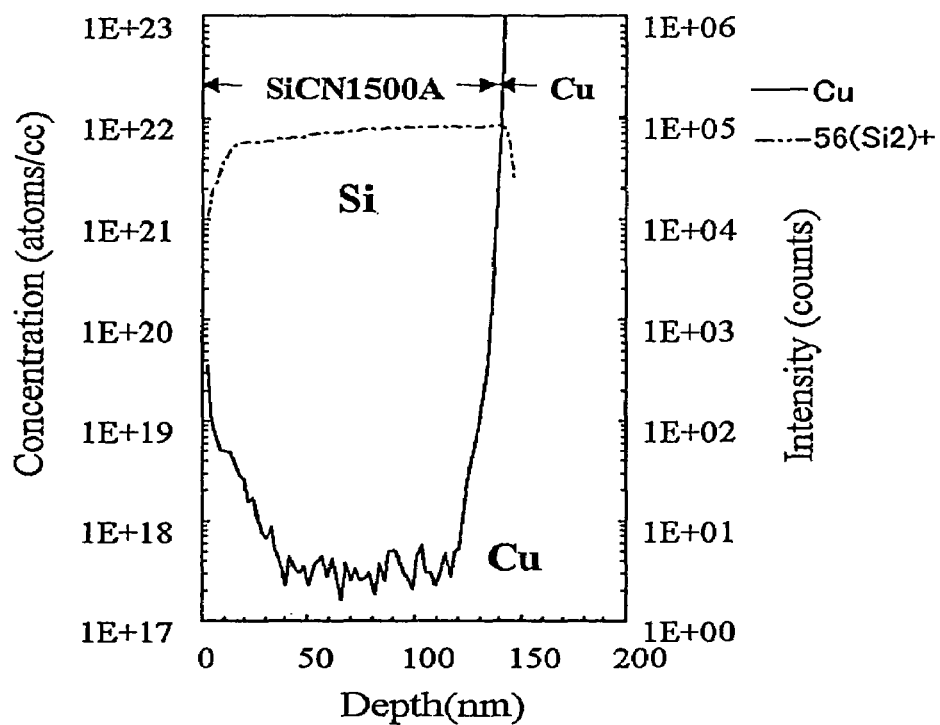
FIGS. 21A and 21B are graph showing the results of the evaluation of the barrier properties of the SiCN film.
Figure 21B:
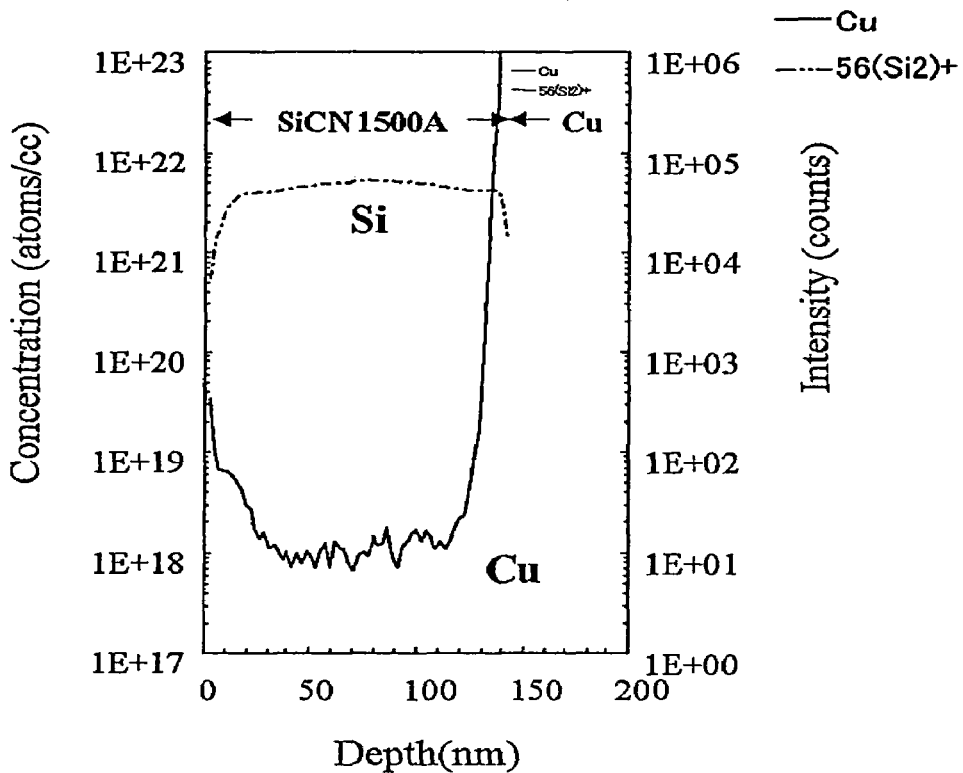

The barrier properties to the thermal diffusion of copper were evaluated for these samples. More specifically, the statuses for the distribution of Si and Cu were measured by secondary ion mass spectrometry (SIMS) for the film just after the deposition (i.e., film as deposited) and for the film after experiencing 10 cycles of the thermal processing at 400 degree C. for 30 minutes. The results are shown in FIGS. 20A, 20B, 21A and 21B. FIGS. 20A and 20B are the results of the evaluation for sample 1. No significant difference in the status of elements existing in the film was seen between the thermally processed film and the film as deposited. FIGS. 21A and 21B are the results of the evaluation for sample 2. It was seen that the concentration of copper in the SiCN film increased by the thermal processing. Thus, it was found that copper diffused into the SiCN in the sample 2.

The difference in the barrier performance to the diffusion of Cu can be represented in relation to the ratio of CH$_2$ bond to CH$_3$ bond. It is considered that larger content of CH$_2$ bond provides higher density, thereby inhibiting the diffusion of Cu atom.

Example 4

Figure 1A:
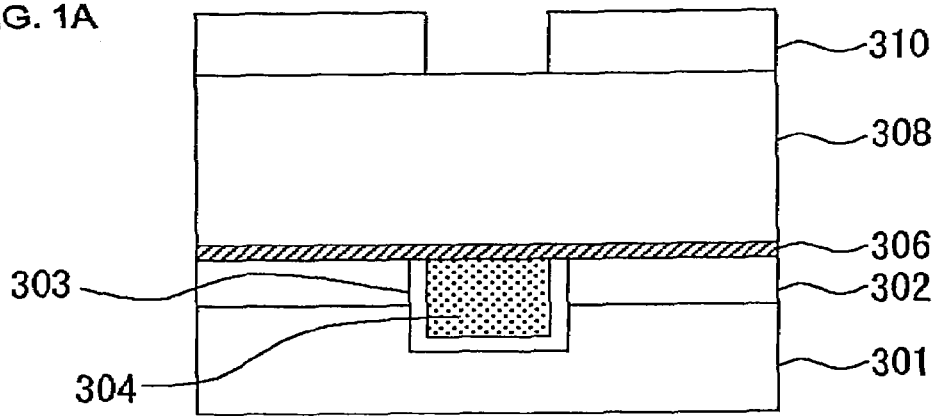
FIGS. 1A to 1D are cross sectional view of a conventional multi-layer interconnect structure, showing the processing steps of the process for forming the conventional copper interconnect.
Figure 1B:
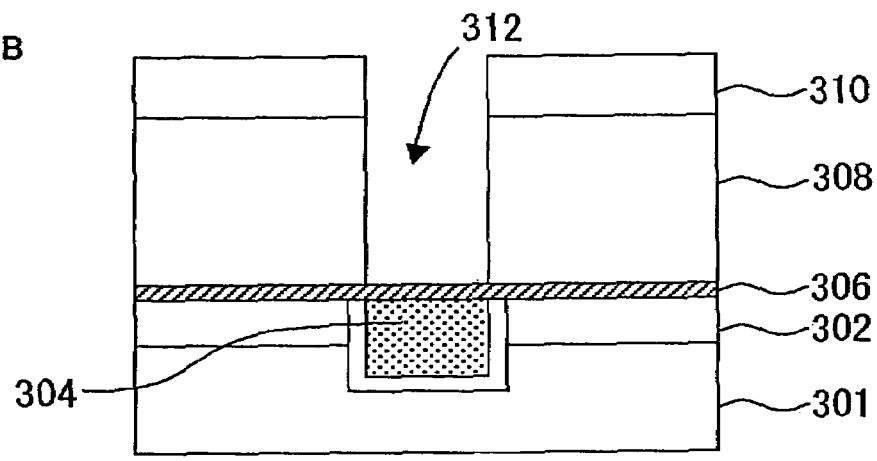
Figure 1C:
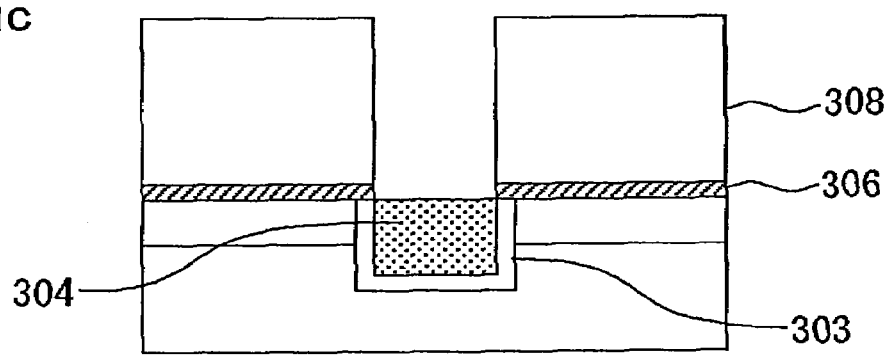
Figure 1D:
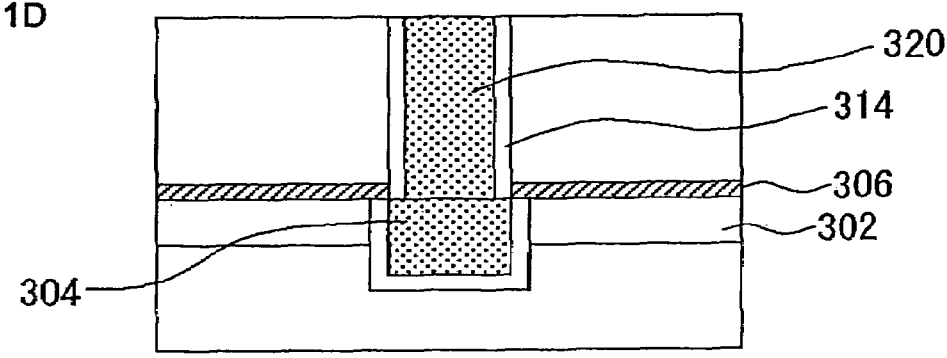
Figure 2:
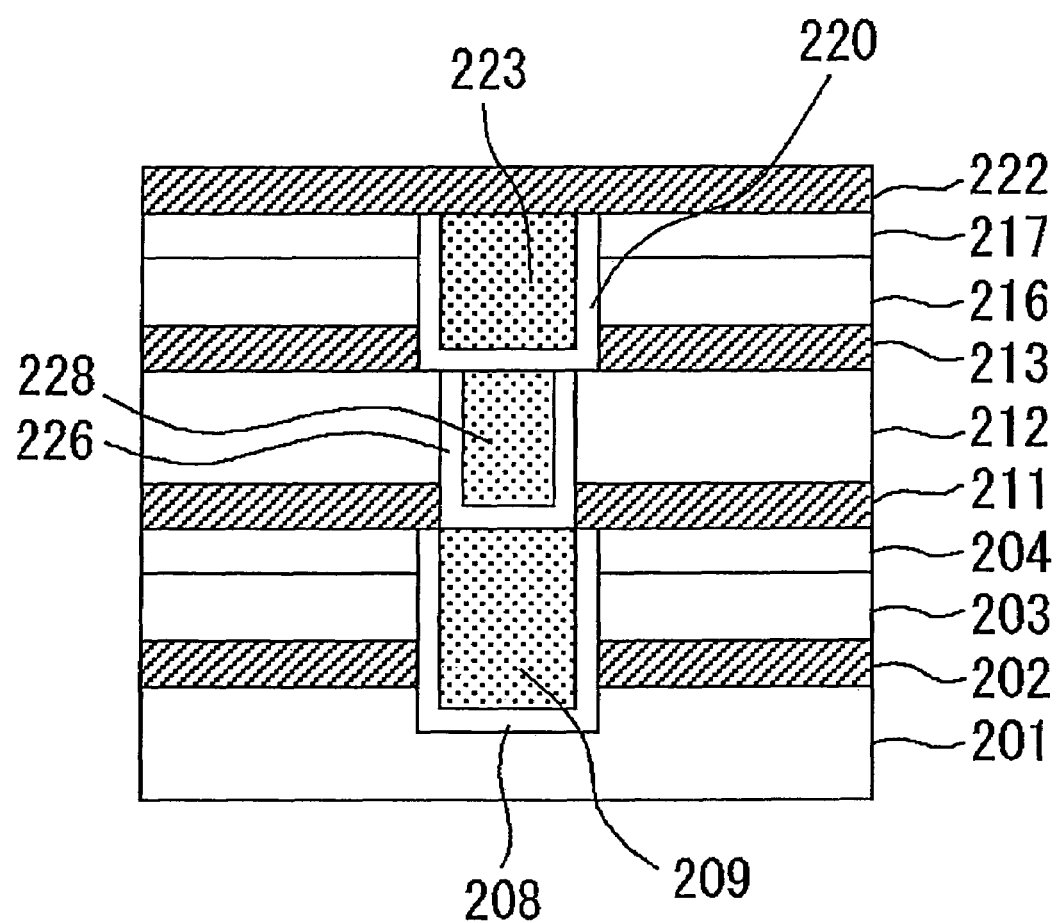
FIG. 2 is a cross sectional view of a multi-layer interconnect structure according to a preferred embodiment of the present invention.

The present example shows an example, in which the present invention was applied to a dual-layer copper interconnect having a single damascene structure. The present example employed a film called L-Ox™, which is a ladder-shaped siloxane hydride. FIG. 2 is a cross sectional view of structure of a semiconductor device according to the present example. The semiconductor device according to the present example has a configuration, in which a lower interconnect comprising a Cu film 209 is coupled to an upper interconnect comprising a Cu film 223 through a copper plug 228.

The lower interconnect comprising the Cu film 209 is formed in multilayer films that include an underlying insulating film 201, a SiCN film 202, a L-Ox™ film 203 and a SiO$_2$ film 204. A side surface and a bottom surface of the Cu film 209 are covered by Ta/TaN films 208.

The copper plug 228 is provided in a hole formed in multilayer films comprising a SiCN film 211 disposed on the SiO$_2$ film 204 and a SiO$_2$ film 212. A side surface and a bottom surface of the hole are covered by Ta/TaN films 226.

The upper interconnect comprising the Cu film 223 is formed in multilayer films comprising a SiCN film 213, L-Ox™ film 216 and a SiO$_2$ film 217. A side surface and a bottom surface of the Cu film 223 are covered by Ta/TaN films 220, and a SiCN film 222 is formed to cover an upper surface thereof.

Next, the method for manufacturing the semiconductor device according to the present example will be described. FIGS. 3A to 3D, 4E to 4G, 5H and 5I, 6J and 6K are cross sectional views of a semiconductor device, showing the processing steps for manufacturing the semiconductor device according to the preferred example.

Figure 3A:
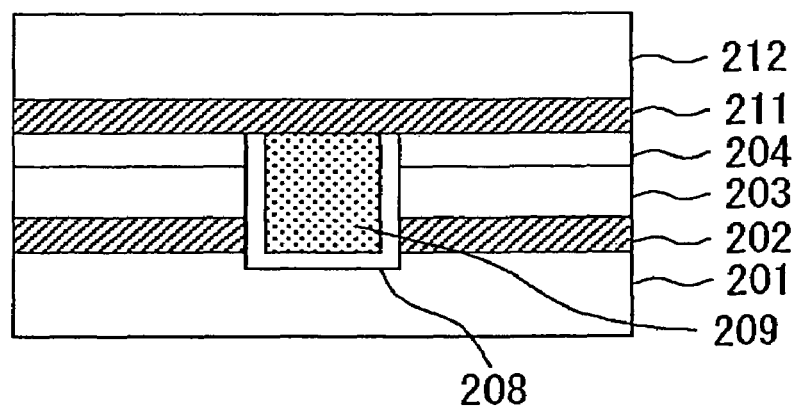
FIGS. 3A to 3D are cross sectional views of the semiconductor devices, showing the processing steps of the process for forming the copper interconnect according to the preferred embodiment of the present invention.

First, a multilayer structure shown in FIG. 3A was formed. An underlying insulating film 201 was disposed on a substrate (not shown) having a semiconductor device formed thereon, and a SiCN film 202, which would be an etch-stop film at the stage of forming an interconnect trench, was deposited via the plasma CVD thereon to a thickness of 50 nm. Then, a L-Ox™ film 203 was formed by an applying method to a thickness of 300 nm, and the baking processing was carried out within N$_2$ atmosphere at 400 degree C. for 30 minutes. Subsequently, a SiO$_2$ film 204 was deposited via the plasma CVD to a thickness of 100 nm. Thereafter, the SiO$_2$ film 204 and the L-Ox™ film 203 were selectively dry-etched to form an interconnect trench 207.

Subsequently, Ta/TaN films 208 and a Cu film 209 were formed to fill the interconnect trench therewith, thereby forming an interconnect. Then, a SiCN film 211 and a SiO$_2$ film 212 were deposited in sequence on the entire surface of the substrate to cover the interconnect. The deposition of the SiCN film 211 was carried out by the plasma CVD, and the process conditions thereof were as follows.

(a) Volumetric flow rate of source gas:
trimethylsilane (3 MS) 150 sccm;
ammonia 300 sccm; and
helium 300 sccm;

(b) plasma power: 300 W; and
(c) deposition chamber pressure: 3.3 Torr.

Here, the infrared absorption spectrum of a SiCN film, which was deposited on a substrate by a process under the conditions same as those for depositing the above described SiCN film 211, was measured, and the result was as follows.
$I_2/I_1$ (Si—H bond/Si—C bond)=0.077; and
$I_3/I_1$ (Si—CH$_3$ bond/Si—C bond)=0.005.

As described above, the layer structure shown in FIG. 3A was obtained.

Figure 3B:
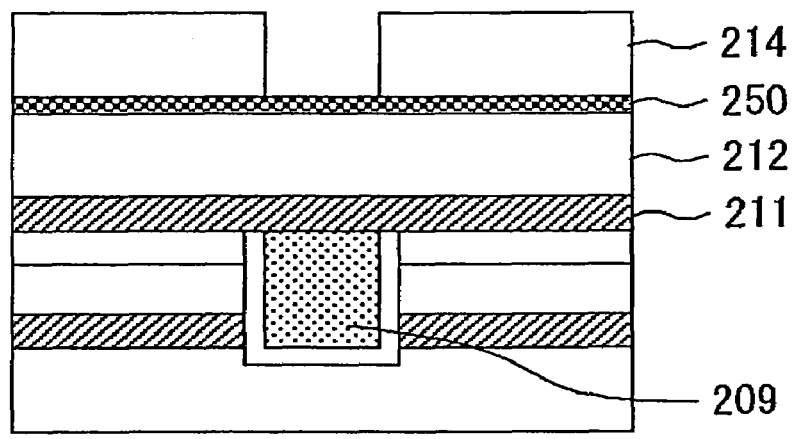

Then, an anti-reflective film 250 and a photo resist 214 were applied on the deposited SiO$_2$ film 212, and a resist pattern for vias was formed via a photolithography technique (FIG. 3B).

Figure 3C:
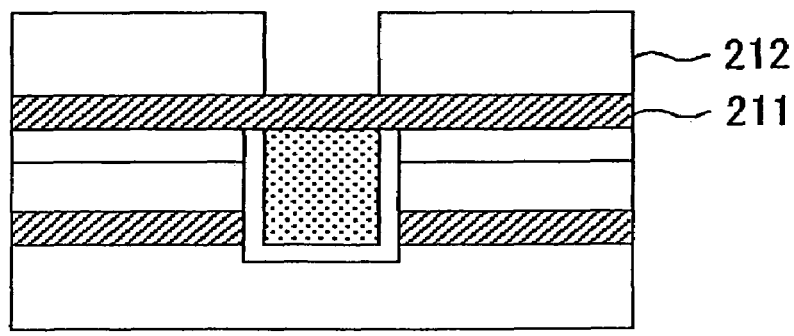
Figure 3D:
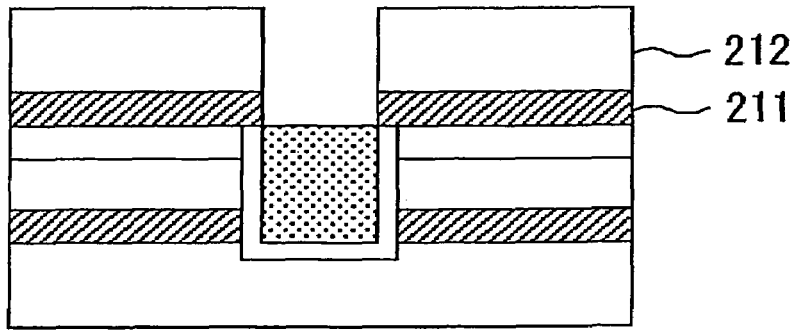

Further, the SiO$_2$ film 212 was etched through the resist pattern for vias by a dry etching technique to form a pattern for vias. Thereafter, ashing process was carried out to strip the photo resist 214 and the anti-reflective film 250 (FIG. 3C). Next, the SiCN film 211 disposed on the bottom of the via was etched back, and the etch residue was stripped with a stripping solution (FIG. 3D).

Figure 4E:
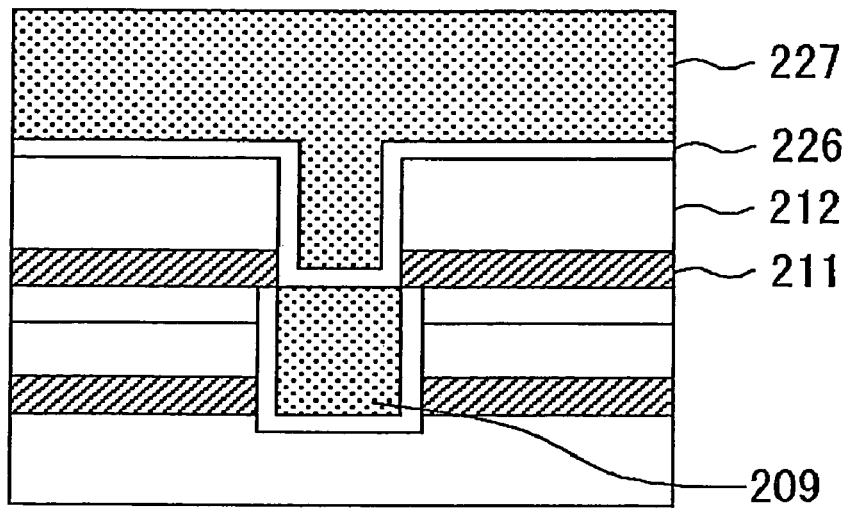
FIGS. 4E to 4G are cross sectional views of the semiconductor devices, showing the processing steps of the process for forming the copper interconnect according to the preferred embodiment of the present invention.

Thereafter, a Ta/TaN films 226 having a thickness of 30 nm was deposited via sputtering process, and a Cu film (not shown) for a seed was formed thereon, and after that, a Cu film 227 was formed to a thickness of 700 nm via the electrolytic plating process to fill the via pattern therewith. Thereafter, a thermal processing was carried out at 400 degree C. for the crystallization (FIG. 4E).

Figure 4F:
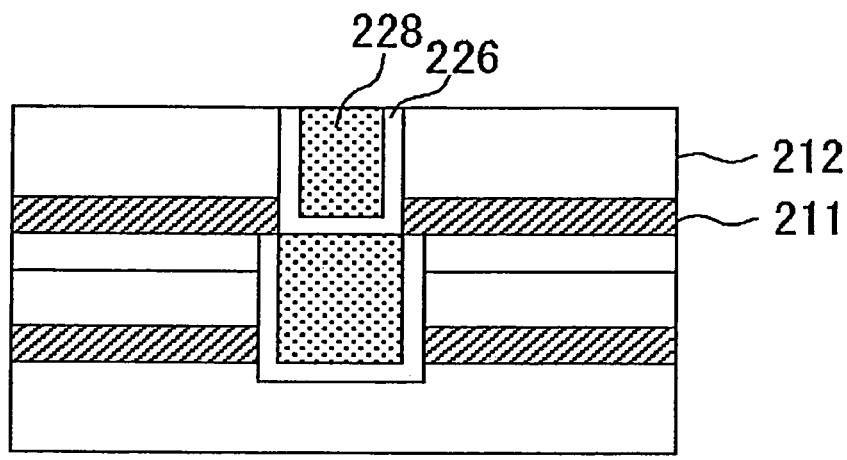

Then, the Cu film 227 and the Ta/TaN films 226 on the SiO$_2$ film 212 were removed by the CMP process (FIG. 4F).

Figure 4G:
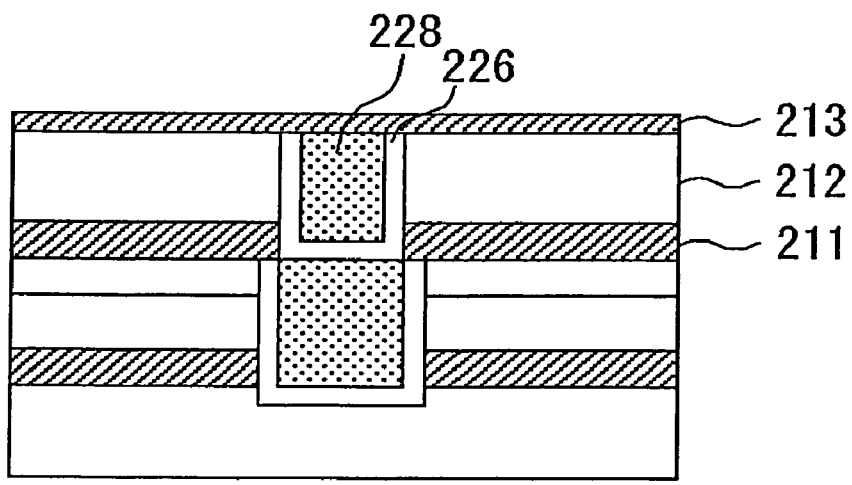

Then, a copper plug 228 was formed by a process same as that employed in the formation of the lower interconnect, and a SiCN film 213, which will be a second Cu-diffusion barrier film, was formed to a thickness of 50 nm (FIG. 4G).

Figure 5H:
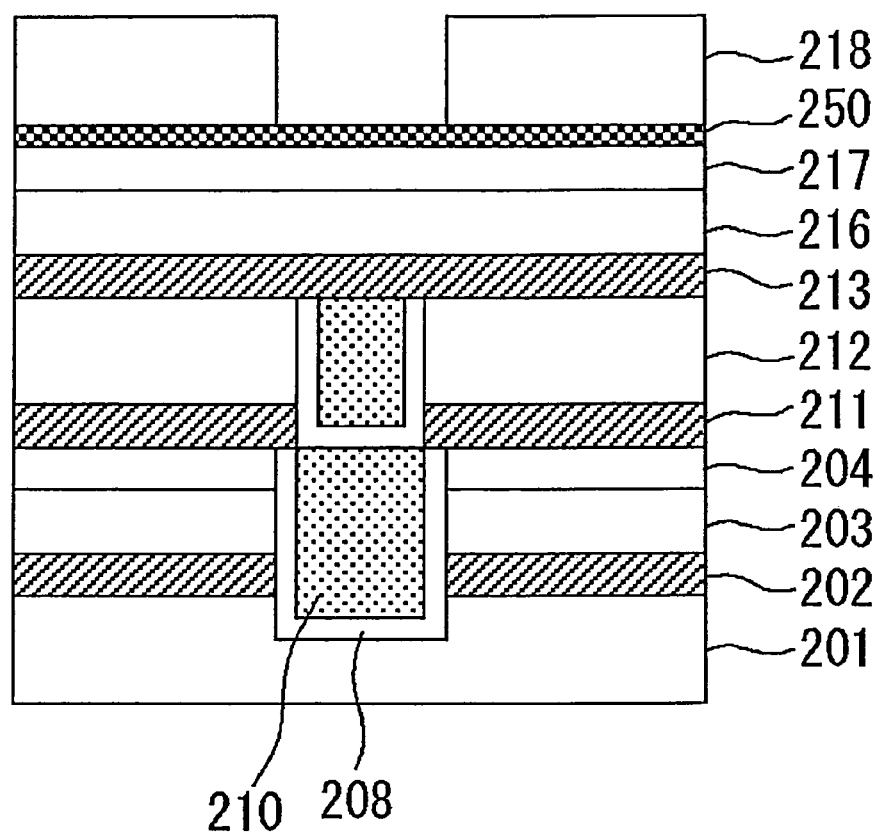
FIGS. 5H and 5I are cross sectional views of the semiconductor devices, showing the processing steps of the process for forming the copper interconnect according to the preferred embodiment of the present invention.

Then, a L-Ox™ film 216, which functions as a second interlayer insulating film, was applied and baked to a thickness of 300 nm, and then a SiO$_2$ film 217 was deposited thereon to a thickness of 100 nm. Next, an anti-reflective film 250 and a photo resist 218 were applied thereon, and an aperture was formed in the photo resist 218 via a photolithography technique (FIG. 5H).

Figure 5I:
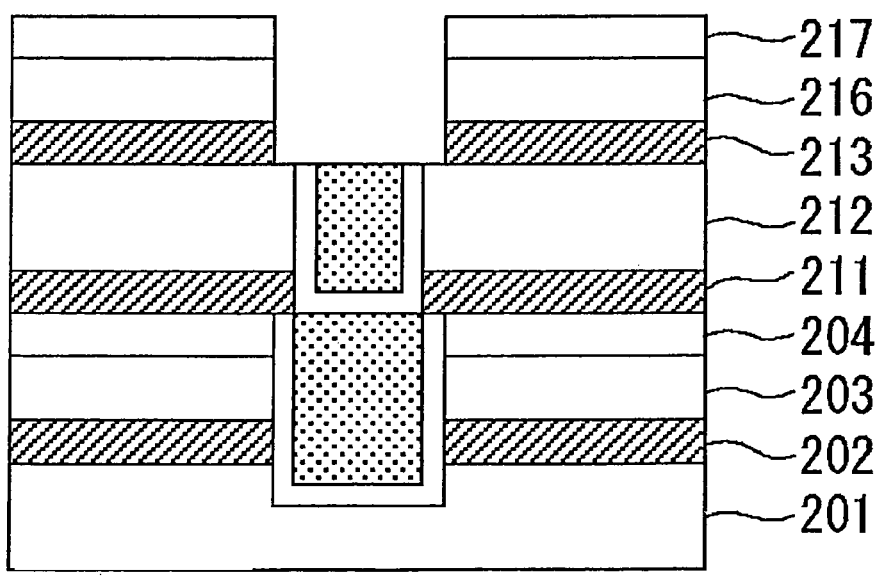

Then, the SiO$_2$ film 217 and the L-Ox™ film 216, which were the interlayer insulating film for the second interconnect, were etched via the mask of the photo resist 218. Then, ashing process was carried out to strip the photo resist 218 and the anti-reflective film 250. Then, the etch back process for the entire surface was carried out to remove the SiCN film 213 of the Cu-diffusion barrier film. Then, the etch residue was stripped with a stripping solution (FIG. 5I).

Figure 6J:
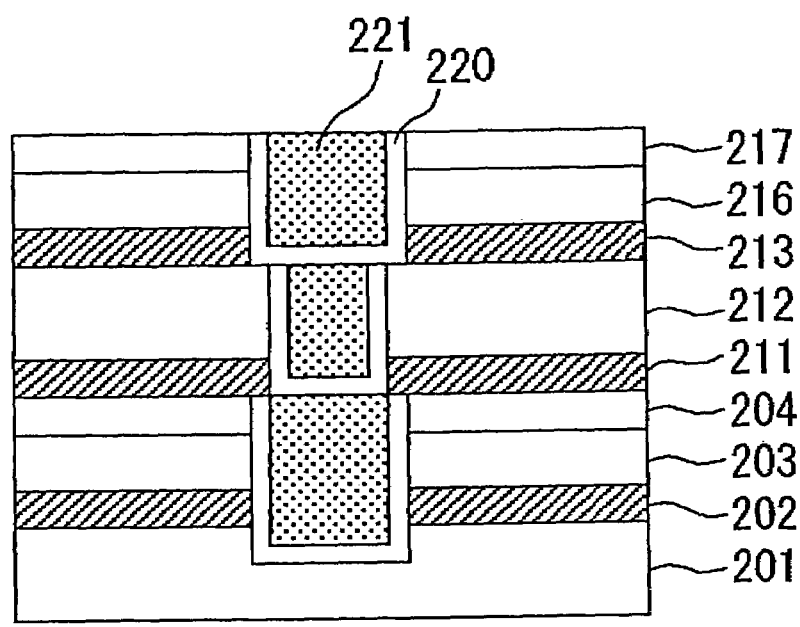
FIGS. 6J and 6K are cross sectional views of the semiconductor devices, showing the processing steps of the process for forming the copper interconnect according to the preferred embodiment of the present invention.

Thereafter, Ta/TaN films 220 were deposited to a thickness of 30 nm via the sputtering process, and a Cu film (not shown) for a seed was formed on the Ta/TaN films 220 to a thickness of 100 nm. Then, a Cu film 221 was formed thereon to a thickness of 700 nm via the electrolytic plating process, and after that, CMP processing was conducted to form the upper interconnect (FIG. 6J).

Figure 6K:
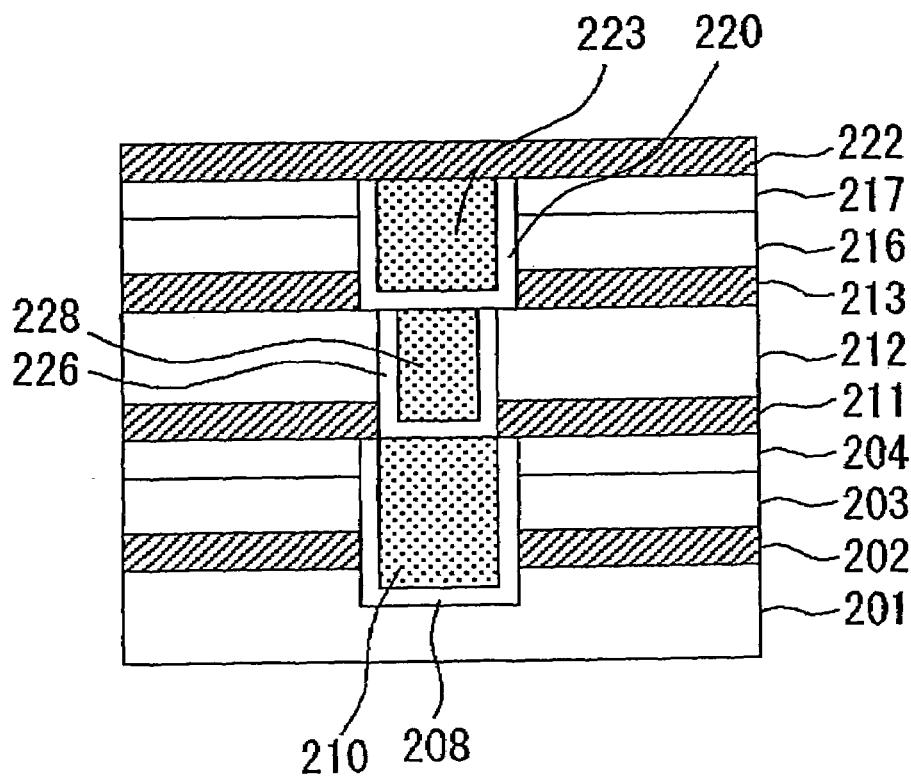

Then, after removing benzotriazole (BTA) layer, a SiCN film 222 of a Cu-diffusion barrier film was formed thereon to a film thickness of 50 nm (FIG. 6K). As described above, the copper multilayer interconnect having the single damascene structure shown in FIG. 2 was formed. Thereafter, a procedure substantially similar to the above described process was employed to form an upper interconnect to manufacture a semiconductor device having 9 interconnect layers. The semiconductor devices were obtained with higher production yield, and the obtained semiconductor devices had better reliability.

Example 5

The present example illustrates an example of employing trimethylvinylsilane, ammonia and helium gases for a source materials for depositing a SiCN film of a diffusion barrier film.

The employed deposition apparatus was the parallel plate plasma CVD apparatus as in the former examples. The conditions for the deposition process were as follows.

(a) Volumetric flow rate of source gas:
trimethylvinylsilane (TMVS) 150 sccm;
ammonia 300 sccm; and
; helium 300 sccm;

(b) plasma power: 300 W; and
(c) deposition chamber pressure: 3 Torr.

Figure 22:
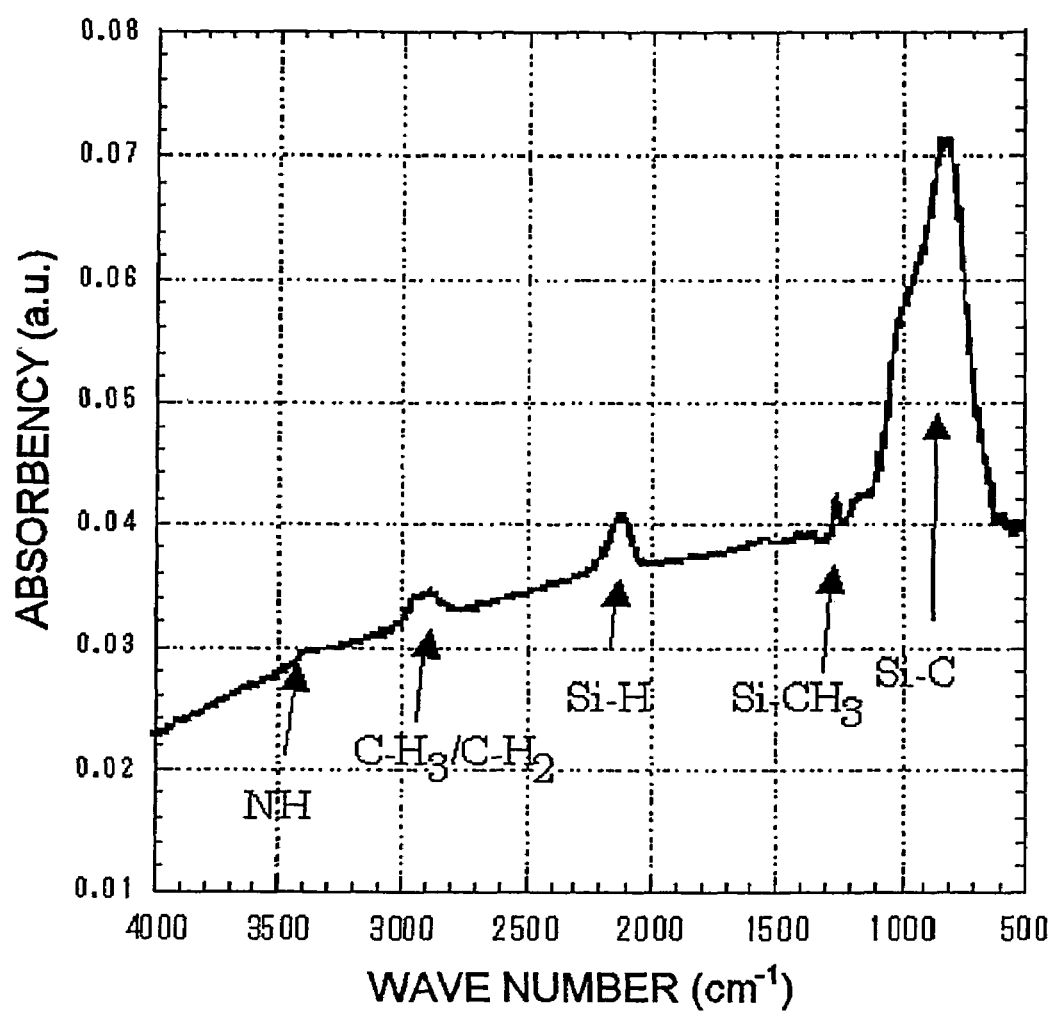
FIG. 22 is a chart of a FT-IR spectrum of the SiCN film.

The infrared absorption spectrum of the obtained films is as shown in FIG. 22. The results of the measurements were obtained as follows.
$I_2/I_1$ (Si—H bond/Si—C bond)=0.069; and
$I_3/I_1$ (Si—CH$_3$ bond/Si—C bond)=0.0059.

Further, it is also found that the relative dielectric constant of the obtained film was about 4.0, and thus these deposition conditions is capable of providing a reduced dielectric constant in comparison with the case employing 3 MS.

Figure 23:
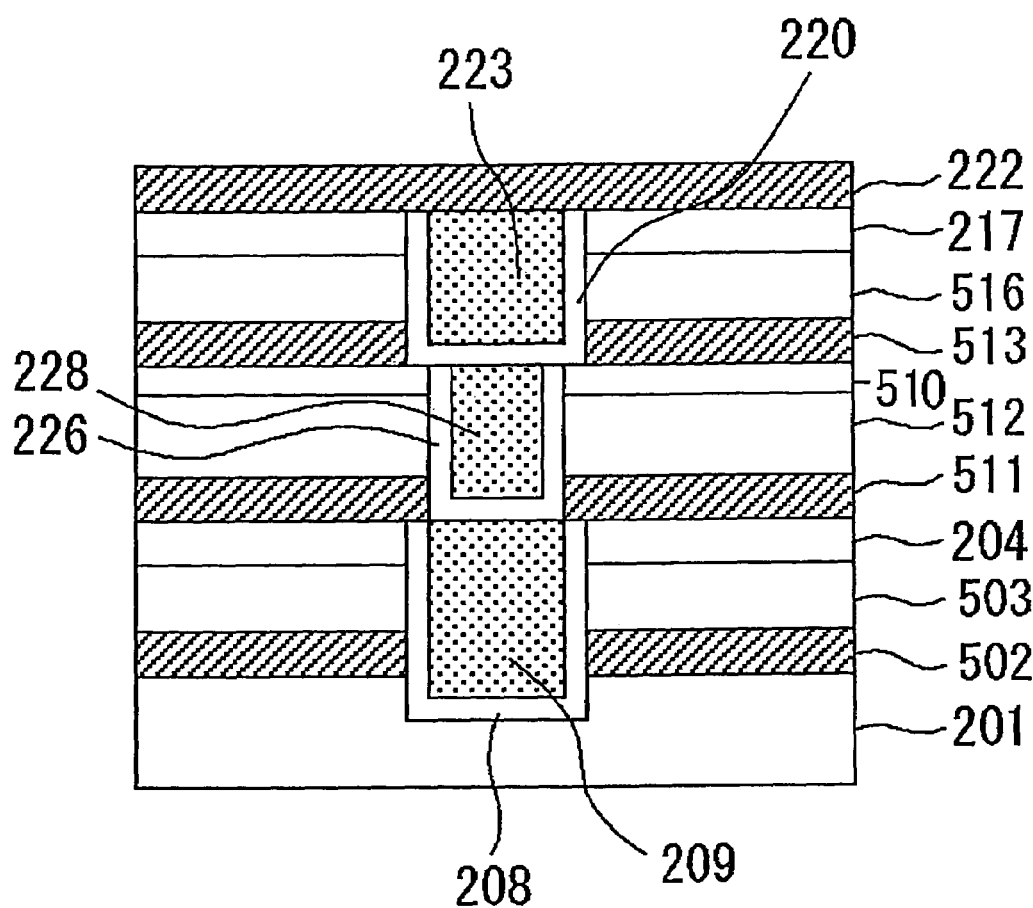
FIG. 23 is a cross sectional view of a multi-layer interconnect structure according to a preferred embodiment of the present invention.

A dual-layer copper interconnect having a single damascene structure was formed by utilizing such film. The interconnect insulating film employed in this example was a SiOCH film, which is a film having lower dielectric constant (relative dielectric constant=2.9). FIG. 23 is a cross sectional view showing the structure of a semiconductor device according to the present example.

The semiconductor device according to the present example has a configuration, in which a lower interconnect comprising a Cu film 209 is coupled to an upper interconnect comprising a Cu film 223 through a copper plug 228.

The lower interconnect comprising the Cu film 209 is formed in multilayer films that include an underlying insulating film 201, a SiCN film 502, a SiOCH film 503 and a SiO$_2$ film 204. A side surface and a bottom surface of the Cu film 209 are covered with Ta/TaN films 208.

The copper plug 228 is provided in a hole formed in multilayer films, which is disposed on the SiO$_2$ film 204 and comprises a SiCN film 511, SiOCH film 512 and a SiO$_2$ film 510. A side surface and a bottom surface of the hole are covered by Ta/TaN films 226.

The upper interconnect comprising the Cu film 223 is formed in multilayer films comprising a SiCN film 513, a SiOCH film 516 and a SiO$_2$ film 217. A side surface and a bottom surface of the Cu film 223 are covered by Ta/TaN films 220, and a SiCN film 222 is formed to cover an upper surface thereof.

Figure 24:
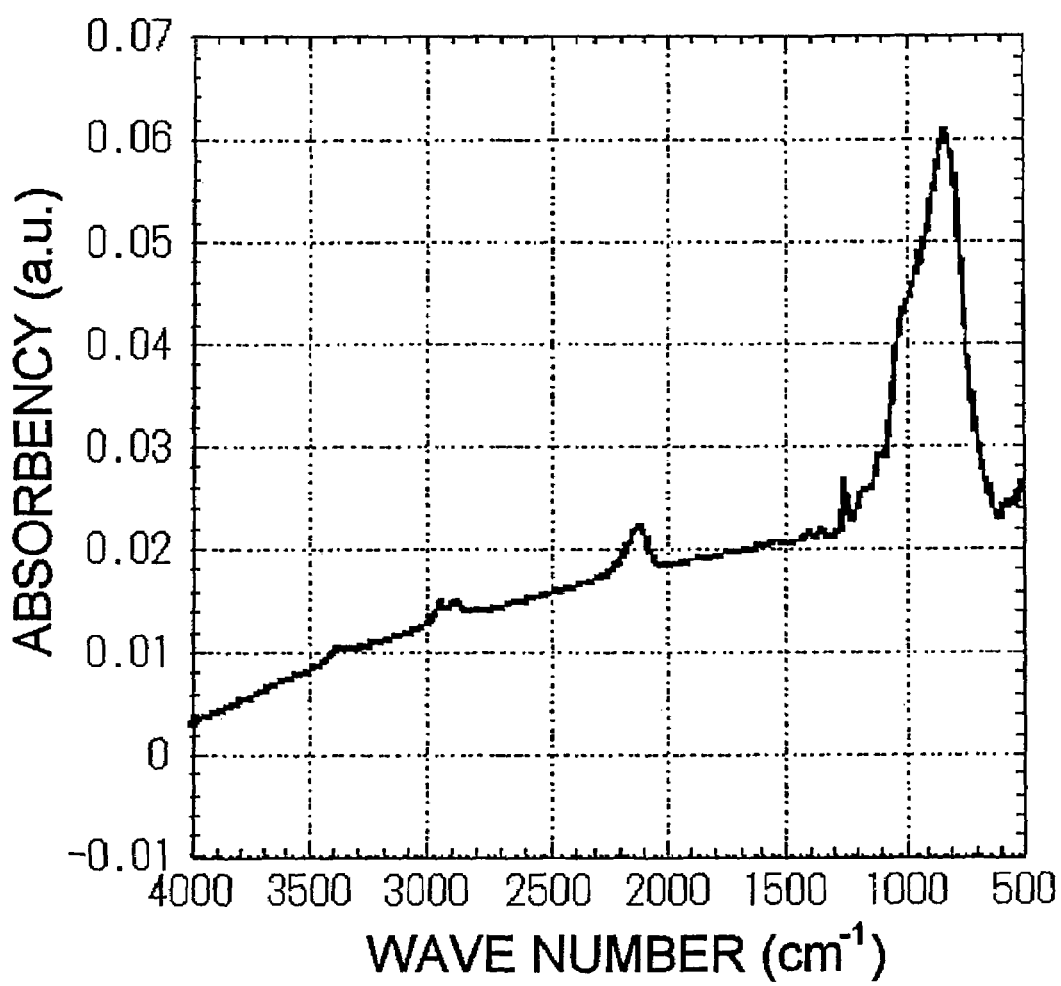
FIG. 24 is a chart of a FT-IR spectrum of the SiCN film.

A cover structure was formed for the obtained layer structure, and electromigration characteristics thereof was evaluated. As a comparative example, a sample comprising SiCN film being manufactured by using 3 MS gas and having an infrared absorption spectrum shown in FIG. 24 was also presented. The spectrum shown in FIG. 24 provides the following result for the SiCN film of the comparative sample:
$I_2/I_1$ (Si—H bond/Si—C bond)=0.055; and
$I_3/I_1$ (Si—CH$_3$ bond/Si—C bond)=0.0090.

That is, such film for the comparative sample is applicable in the criteria described before in relation to the failure of the operation of the device, i.e., $I_2/I_1$ (Si—H bond/Si—C bond)<0.067; and
$I_3/I_1$ (Si—CH$_3$ bond/Si—C bond)>0.0067.

Figure 25:
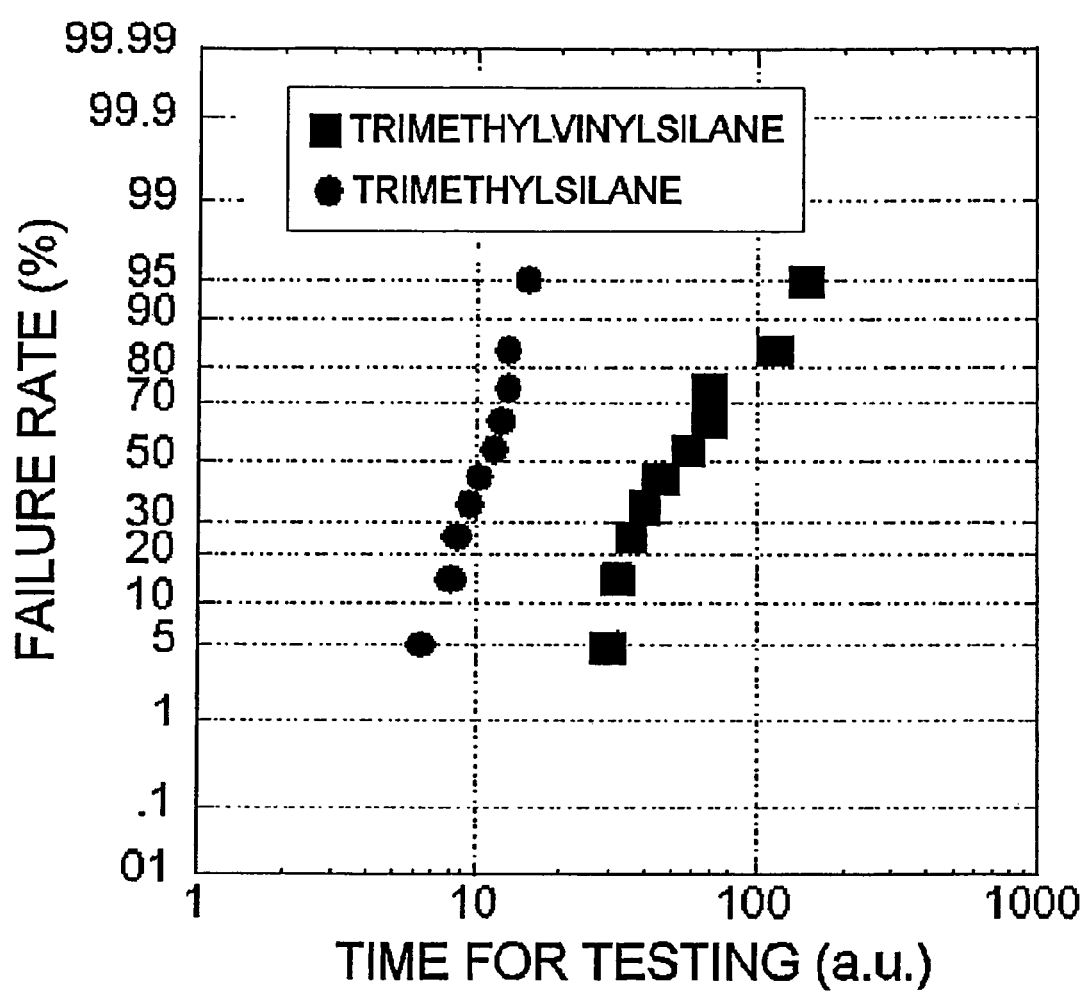
FIG. 25 is a graph showing results of the evaluations for the electromigration resistance of the SiCN films prepared in the example.

FIG. 25 shows results of evaluations of the electromigration resistance for two types of samples having each of the above-mentioned two types of SiCN films. Sample 1 includes the SiCN film deposited by using trimethylvinylsilane (TMVS), and sample 2 includes the SiCN film deposited by using trimethylsilane (3 MS). The electromigration characteristics of the sample 1, which includes the SiCN film deposited by using TMVS, was improved with five folds or higher, compared to that of the comparative sample 2, which includes the SiCN film deposited by using 3 MS. It is considered that the reason is that the ratio of the absorption areas of the sample 1 having SiCN film deposited by using TMVS satisfies the criteria for obtaining better adhesiveness and lower dielectric constant described in the example 2, that is:

$I_2/I_1$ (Si—H bond/Si—C bond)≧0.067; and
$I_3/I_1$ (Si—CH$_3$ bond/Si—C bond)≦0.0067, and that the SiCN film included in the comparative sample 2 does not satisfy the criteria.

It is supposed that the SiCN film has an improved adhesiveness with the Cu film by having increased Si—H and reduced Si—CH$_3$, and thus the improvement in the electromigration characteristics thereof is achieved.

Although the examples are described in relation to the cases employing TMVS, other compounds may be employed as long as the compound contains vinyl group, and the exemplary compounds for obtaining similar results to those using TMVS may be dimethyldivinylsilane, monomethyltrivinylsilane or tetravinylsilane.

Although the present invention is described with respect to the preferred embodiments, it should be understood that the disclosures contained herein are by way of illustration only, and optionally the configuration and/or the process thereof may be partially substituted with other configuration and/or process.

For example, although the copper interconnect is employed in the above described preferred examples, the interconnect may also be a copper alloy interconnect, which is formed of an alloy of copper with at least one different element selected from the group consisting of: Al (aluminum); Ag (silver); W (tungsten); Mg (magnesium); Be (beryllium); Zn (zinc); Pd (palladium); Cd (cadmium); Au (gold); Hg (mercury); Pt (platinum); Zr (zirconium); Ti (titanium); Sn (tin); Ni (nickel); Nd (neodymium); and Fe (iron).

Although the Ta/TaN films are employed for the barrier metal in the above disclosures of the examples, the present invention may have a configuration, in which the barrier metal comprises at least one selected from the group consisting of: Ti; TiN; TiSiN; Ta; TaN; and TaSiN.

What is claimed is:

1. A method for manufacturing a semiconductor device, comprising:
   forming a first insulating film on a semiconductor substrate;
   selectively removing said first insulating film to form an interconnect trench;
   filling said interconnect trench with a metal to form a metal film; and
   depositing a diffusion barrier film including an insulating material containing silicon, carbon, hydrogen and nitrogen as constituent elements to cover the upper surface of said metal film, wherein the insulating material contains Si—H bond, Si—C bond and methylene bond (—CH$_2$—),
   wherein said depositing said diffusion barrier film is conducted by a plasma CVD utilizing a source gas containing:
   (a) trimethylsilane or tetramethylsilane; and
   (b) a nitrogen-containing compound,
   and wherein a pressure during said depositing said diffusion barrier film is not higher than 4 Torr.

2. A method for manufacturing a semiconductor device, comprising:
   forming a first insulating film on a semiconductor substrate;
   selectively removing said first insulating film to form an interconnect trench;
   filling said interconnect trench with a metal to form a metal film; and
   depositing a diffusion barrier film including an insulating material containing silicon, carbon, hydrogen and nitrogen as constituent elements to cover the upper surface of said metal film, wherein the insulating material contains Si—H bond. Si—C bond and methylene bond (—CH$_2$—),
   and wherein said depositing said diffusion barrier film is conducted by a plasma CVD utilizing a source gas containing:
   (a) vinyl group-containing silane; and
   (b) a nitrogen-containing compound.

3. The method as set forth in claim 2, wherein said vinyl group-containing silane is selected from the group consisting of trimethylvinylsilane, dimethyldivinylsilane, monomethyltrivinylsilane, and tetravinylsilane.

4. The method as set forth in claim 2, wherein an infrared absorption spectrum of said insulating material includes:
   $I_2/I_1$ of not lower than 0.067; where $I_1$ is defined as an absorption area of an infrared absorption band having a peak near 810 cm$^{-1}$, and $I_2$ is defined as an absorption area of an infrared absorption band having a peak near 2,120 cm$^{-1}$.

5. The method as set forth in claim 2, wherein an infrared absorption spectrum of said insulating material includes:
   $I_3/I_1$ of not higher than 0.0067; where $I_1$ is defined as an absorption area of an infrared absorption band having a peak near 810 cm$^{-1}$, and $I_3$ is defined as an absorption area of an infrared absorption band having a peak near 1,250 cm$^{-1}$.

6. The method as set forth in claim 4, wherein an infrared absorption spectrum of said insulating material includes:
   $I_3/I_1$ of not higher than 0.0067; where $I_1$ is defined as an absorption area of an infrared absorption band having a peak near 810 cm$^{-1}$, and $I_3$ is defined as an absorption area of an infrared absorption band having a peak near 1,250 cm$^{31\ 1}$.

7. The method as set forth in claim 2, wherein said metal film contains copper as a main constituent.

8. The method as set forth in claim 4, wherein said metal film contains copper as a main constituent.

9. The method as set forth in claim 5, wherein said metal film contains copper as a main constituent.

10. The method as set forth in claim 6, wherein said metal film contains copper as a main constituent.

11. The method as set forth in claim 1, wherein an infrared absorption spectrum of said insulating material includes:
    $I_2/I_1$ of not lower than 0.067; where $I_1$ is defined as an absorption area of an infrared absorption band having a peak near 810 cm$^{-1}$, and $I_2$ is defined as an absorption area of an infrared absorption band having a peak near 2,120 cm$^{-1}$.

12. The method as set forth in claim 1, wherein an infrared absorption spectrum of said insulating material includes:

$I_3/I_1$ of not higher than 0.0067; where $I_1$ is defined as an absorption area of an infrared absorption band having a peak near 810 cm$^{-1}$, and $I_3$ is defined as an absorption area of an infrared absorption band having a peak near 1,250 cm$^{-1}$.

13. The method as set forth in claim 11, wherein an infrared absorption spectrum of said insulating material includes:

$I_3/I_1$ of not higher than 0.0067; where $I_1$ is defined as an absorption area of an infrared absorption band having a peak near 810 cm$^{-1}$, and $I_3$ is defined as an absorption area of an infrared absorption band having a peak near 1,250 cm$^{-1}$.

14. The method as set forth in claim 1, wherein said metal film contains copper as a main constituent.

15. The method as set forth in claim 11, wherein said metal film contains copper as a main constituent.

16. The method as set forth in claim 12, wherein said metal film contains copper as a main constituent.

17. The method as set forth in claim 13, wherein said metal film contains copper as a main constituent.

\* \* \* \* \*